(12) United States Patent
So et al.

(10) Patent No.: US 10,236,460 B2
(45) Date of Patent: Mar. 19, 2019

(54) PHOTOVOLTAIC CELL ENHANCEMENT THROUGH UVO TREATMENT

(75) Inventors: Franky So, Gainesville, FL (US); John R. Reynolds, Dunwoody, GA (US); Song Chen, Gainesville, FL (US); Cephas Small, Gainesville, FL (US)

(73) Assignee: University of Florida Research Foundation, Incorporated, Gainsville, FL (US)

( * ) Notice: Subject to any disclaimer, the term of this patent is extended or adjusted under 35 U.S.C. 154(b) by 805 days.

(21) Appl. No.: 13/555,794

(22) Filed: Jul. 23, 2012

(65) Prior Publication Data

US 2013/0019937 A1 Jan. 24, 2013

Related U.S. Application Data

(60) Provisional application No. 61/510,804, filed on Jul. 22, 2011.

(51) Int. Cl.
*H01L 51/46* (2006.01)
*H01L 51/44* (2006.01)
*H01L 51/42* (2006.01)

(52) U.S. Cl.
CPC ........ *H01L 51/442* (2013.01); *H01L 51/4253* (2013.01); *H01L 2251/308* (2013.01); *Y02E 10/549* (2013.01)

(58) Field of Classification Search
CPC ............................ H01L 51/4253; Y02E 10/549
USPC ........................................................ 136/263
See application file for complete search history.

(56) References Cited

U.S. PATENT DOCUMENTS

| | | | | |
|---|---|---|---|---|
| 2004/0164674 | A1* | 8/2004 | Ottermann et al. | 313/506 |
| 2007/0289626 | A1* | 12/2007 | Brabec | H01G 9/2072 136/263 |
| 2008/0143906 | A1* | 6/2008 | Allemand | B82Y 10/00 349/43 |
| 2009/0308456 | A1* | 12/2009 | Rand | H01L 51/0038 136/261 |
| 2011/0041980 | A1* | 2/2011 | Kim | H01L 51/441 156/60 |
| 2011/0256422 | A1* | 10/2011 | Reichelt et al. | 428/704 |

FOREIGN PATENT DOCUMENTS

WO    WO 2010049512 A1 *  5/2010

OTHER PUBLICATIONS

Mahamuni et al. ZnO Nanoparticles Embedded in Polymeric Matricies. NanoStructured Materials, vol. 7, No. 6, pp. 659-666, 1999.*

(Continued)

*Primary Examiner* — Susan D Leong
*Assistant Examiner* — Dujuan A Horton
(74) *Attorney, Agent, or Firm* — Alston & Bird LLP

(57) ABSTRACT

Photovoltaic cells, methods of fabricating photovoltaic cells, and methods of using photovoltaic cells to capture light energy are provided. A photovoltaic cell can include an electron transporting layer, a photoactive layer, and a hole transporting layer. The electron transporting layer can be ultraviolet ozone treated. The photovoltaic cell can have an inverted configuration.

22 Claims, 15 Drawing Sheets

(56) References Cited

OTHER PUBLICATIONS

Aliaga, C., et al., "Sum Frequency Generation and Catalytic Reaction Studies of the Removal of Organic Capping Agents from Pt Nanoparticles by UV-Ozone Treatment," *Journal of Physical Chemisty C*, Apr. 16, 2009, vol. 113, No. 15, pp. 6150-6155.
Amb, C.M., et al., "Dithienogermole as a Fused Electron Donor in Bulk Heterojunction Solar Cells," *Journal of the American Chemical Society*, Jul. 6, 2011, vol. 133, No. 26, pp. 10062-10065.
Beaujuge, P.M., et al., "Green Dioxythiophene-Benzothiadiazole Donor-Acceptor Copolymers for Photovoltaic Device Applications," *Chemistry of Materials*, Mar. 23, 2010, vol. 22, No. 6, pp. 2093-2106.
Beek, W.J.E., et al., "Hybrid Zinc Oxide Polymer Bulk Heterojunction Solar Cells," *Journal of Physical Chemistry B*, May 19, 2005, vol. 109, No. 19, pp. 9505-9516.
Cavaleri, J.J., et al., "Femtosecond Study of the Size-Dependent Charge Carrier Dynamics in ZnO Nanocluster Solutions," *Journal of Chemical Physics*, Oct. 1, 1995, vol. 103, No. 13, pp. 5378-5386.
Chen, H.Y., et al., "Polymer Solar Cells with Enhanced Open-Circuit Voltage and Efficiency," *Nature Photonics*, Nov. 2009, vol. 3, No. 11, pp. 649-653.
Chen, L.M., et al., "Recent Progress in Polymer Solar Cells: Manipulation of Polymer:Fullerene Morphology and the Formation of Efficient Inverted Polymer Solar Cells," *Advanced Materials*, Apr. 20, 2009, vol. 21, No. 14-15, pp. 1434-1449.
Chu, T.Y., "Bulk Heterojunction Solar Cells Using Thieno[3,4-c]pyrrole-4,6-dione and Dithieno[3,2-b:2'3'-d]silole Copolymer with a Power Conversion Efficiency of 7.3%," *Journal of the American Chemical Society*, Mar. 30, 2011, vol. 133, No. 12, pp. 4250-4253.
Du, T., et al., "Sol-Gel Derived ZnO/PVP Nanocomposite Thin Film for Superoxide Radical Sensor," *Materials Science and Engineering C*, Apr. 2007, vol. 27, No. 3, pp. 414-420.
Du, T., et al., "Synthesis and Morphological Characterization on PVP/ZnO Nano Hybrid Films," *Journal of Materials Science*, 2004, vol. 39, No. 19, pp. 6105-6109.
Guo, L., et al., "Synthesis and Characterization of Poly(vinylpyrrolidone)-Modified Zinc Oxide Nanoparticles," *Chemistry of Materials*, Aug. 2000, vol. 12, No. 8, pp. 2268-2274.
Hau, S.K., et al., "Air-Stable Inverted Flexible Polymer Solar Cells Using Zinc Oxide Nanoparticles as an Electron Selective Layer," *Applied Physics Letters*, Jun. 23, 2008, vol. 92, No. 25, p. 253301.
Irfan, et al., "Energy Level Evolution of Molybdenum Trioxide Interlayer Between Indium Tin Oxide and Organic Semiconductor," *Applied Physics Letters*, Feb. 15, 2010, vol. 96, No. 7, p. 073304.
Jorgensen, M., et al., "Stability/Degradation of Polymer Solar Cells," *Solar Energy Materials and Solar Cells*, Jul. 2008, vol. 92, No. 7, pp. 686-714.
Kawano, K., et al., "Degradation of Organic Solar Cells Due to Air Exposure," *Solar Energy Materials and Solar Cells*, Dec. 15, 2006, vol. 90, No. 20, pp. 3520-3530.
Kim, D.Y., et al., "The Effect of Molybdenum Oxide Interlayer on Organic Photovoltaic Cells," *Applied Physics Letters*, Aug. 31, 2009, vol. 95, No. 9, p. 093304.
Krebs, F.C., "All Solution Roll-to-Roll Processed Polymer Solar Cells Free from Indium-Tin-Oxide and Vacuum Coating Steps," *Organic Electronics*, Aug. 2009, vol. 10, No. 5, pp. 761-768.
Krebs, F.C., "Polymer Solar Cell Modules Prepared Using Roll-to-Roll Methods: Knife-Over-Edge Coating, Slot-Die Coating and Screen Printing," *Solar Energy Materials and Solar Cells*, Apr. 2009, vol. 93, No. 4, pp. 465-475.
Krebs, F.C., et al., "A Roll-to-Roll Process to Flexible Polymer Solar Cells: Model Studies, Manufacture and Operational Stability Studies," *Journal of Materials Chemistry*, 2009, vol. 19, No. 30, pp. 5442-5451.
Li, G., et al., "Efficient Inverted Polymer Solar Cells," *Applied Physics Letters*, Jun. 19, 2006, vol. 88, No. 25, p. 253503.
Monticone, S., et al., "Complex Nature of the UV and Visible Fluorescence of Colloidal ZnO Nanoparticles," *Journal of Physical Chemistry B*, Apr. 16, 1998, vol. 102, No. 16, pp. 2854-2862.
Norrman, K., et al., "Water-Induced Degradation of Polymer Solar Cells Studied by $H_2^{18}O$ Labeling," *ACS Applied Materials and Interfaces*, Jan. 28, 2009, vol. 1, No. 1, pp. 102-112.
Park, J.Y., et al., "The Role of Organic Capping Layers of Platinum Nanoparticles in Catalytic Activity of CO Oxidation," *Catalysis Letters*, 2009, vol. 129, No. 1-2, pp. 1-6.
Sakohara, S., et al., "Visible Luminescence and Surface Properties of Nanosized ZnO Colloids Prepared by Hydrolizing Zinc Acetate," *Journal of Physical Chemistry B*, Dec. 10, 1998, vol. 102, No. 50, pp. 10169-10175.
Singla, M.L., et al., "Optical Characterization of ZnO Nanoparticles Capped with Various Surfactants," *Journal of Luminescence*, May 2009, vol. 129, No. 5, pp. 434-438.
Subbiah, J., et al., "Combined Effects of $MoO_3$ Interlayer and $PC_{70}BM$ on Polymer Photovoltaic Device Performance," *Organic Electronics*, May 2010, vol. 11, No. 5, pp. 955-958.
Subbiah, J., et al., "$MoO_3$/poly(9,9-dioctylfluorene-co-N-[4-(3-methylpropyl)]-diphenylamine Double-Interlayer Effect on Polymer Solar Cells," *Applied Physics Letters*, 1996, Feb. 8, 2010, vol. 96, No. 6, p. 063303.
Sun, Y.M., et al., "Inverted Polymer Solar Cells Integrated with a Low-Temperature-Annealed Sol-Gel-Derived ZnO Film as an Electron Transport Layer," *Advanced Materials*, Apr. 12, 2011, vol. 23, No. 14, pp. 1679-1683.
Tang, H., et al., "Gas Sensing Behavior of Polyvinylpyrrolidone-Modified ZnO Nanoparticles for Trimethylamine," *Sensors and Actuators B*, Jan. 17, 2006, vol. 113, No. 1, pp. 324-328.
Xu, Z., et al., "Vertical Phase Separation in Poly(3-hexylthiophene):Fullerene Derivative Blends and its Advantage for Inverted Structure Solar Cells," *Advanced Functional Materials*, Apr. 23, 2009, vol. 19, No. 8, pp. 1227-1234.
Zhang, Y., et al., "X-Ray Photoelectron Spectroscopy Study of ZnO Films Grown by Metal-Organic Chemical Vapor Deposition," *Journal of Crystal Growth*, May 2003, vol. 252, No. 1-3, pp. 180-183.
Du, T., et al., "Chapter 93 of Synthesis and Characterization of Sol-Gel Derived Nanostructured Composite of ZnO/PVP Thin Film as Biosensor", Mar. 26, 2008, pp. 615-620, Wiley Online Library.
Gobi, K. Vengatajalabathy, et al., "Efficient mediatorless superoxide sensors using cytochrome c-modified electrodes: Surface nano-organization for selectivity and controlled peroxidase activity", *Journal of Electroanalytical Chemistry*, Apr. 2000, 484(2):172-181, Elsevier.
Mousa, J.M., et al., "Effect of Annealing Temperature on the Crystallographic and Optical Properties of ZnO Films", Journal of the College of Basic Education, 2009, pp. 159-170, vol. 13, Issue 59, Al-Mustansyriah University, Iraq.
Sapford, K.E., et al., "Fluorescence-based array biosensors for detection of biohazards", *Journal of Applied Microbiology*, 2004, pp. 47-58, vol. 96, The Society for Applied Microbiology, UK.
Troy, C.T., "New Sensor Combines CMOS and CCD", *Photonics spectra*, Dec. 1997, pp. 31-31.

\* cited by examiner

● ZnO nanocrystals
∿ PVP chains

PHOTOVOLTAIC CELL ENHANCEMENT THROUGH UVO TREATMENT

CROSS-REFERENCE TO RELATED APPLICATION

The present application claims the benefit of U.S. Provisional Application Ser. No. 61/510,804, filed Jul. 22, 2011, which is hereby incorporated by reference in its entirety, including any figures, tables, or drawings.

The subject invention was made with government support under the Office of Naval Research, Contract No. N000141110245; the Department of Energy Basic Energy Sciences, Contract No. DE-FG0207ER46464; and the Air Force Office of Scientific Research, Contract No. FA9550-09-1-0320. The government has certain rights to this invention.

BACKGROUND OF THE INVENTION

Photovoltaic cells are considered an important source of renewable energy for helping to solve the world's energy shortage today. Various photovoltaic cell technologies have been developed, and polymer bulk heterojunction (BHJ) photovoltaic cells have received attention because of their compatibility with large-scale roll-to-roll (R2R) processing. These photovoltaic cells typically exhibit low power conversion efficiencies of less than 3%.

BRIEF SUMMARY OF THE INVENTION

Embodiments of the subject invention are drawn to novel and advantageous photovoltaic cells, as well as methods of manufacturing and methods of using such photovoltaic cells. A photovoltaic cell can have an inverted configuration and can include at least one layer that has been treated with an ultraviolet ozone (UVO) treatment. The UVO-treated layer can be an electron transporting layer (ETL), and the ETL can be, for example, a metal oxide or a metal oxide-polymer nanocomposite layer.

In an embodiment, a photovoltaic cell can include: a first electrode; an ETL; a photoactive layer; a hole transporting layer (HTL); and a second electrode. The ETL can be UVO-treated.

In another embodiment, a method of fabricating a photovoltaic cell can include: forming an ETL on a first electrode; performing UVO treatment on the ETL to provide a UVO-treated ETL; forming a photoactive layer on the UVO-treated ETL; forming an HTL on the photoactive layer; and forming a second electrode on the HTL.

In another embodiment, a method of capturing light energy from light can include: providing a photovoltaic cell such that the light is incident upon the photovoltaic cell. The photovoltaic cell can be as described herein.

DETAILED DISCLOSURE OF THE INVENTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present. When the term "directly on" is used herein, when referring to layers, regions, patterns, or structures, it is understood that the layer, region, pattern or structure is directly on another layer or structure, such that no intervening layers, regions, patterns, or structures are present.

When the term "about" is used herein, in conjunction with a numerical value, it is understood that the value can be in a range of 95% of the value to 105% of the value, i.e. the value can be +/−5% of the stated value. For example, "about 1 kg" means from 0.95 kg to 1.05 kg.

Embodiments of the subject invention are drawn to novel and advantageous photovoltaic cells, as well as methods of manufacturing and methods of using such photovoltaic cells. A photovoltaic cell can have an inverted configuration and can include at least one layer that has been treated with an ultraviolet ozone (UVO) treatment. The UVO-treated layer can be an electron transporting layer (ETL), and the ETL can be, for example, a metal oxide-polymer nanocomposite layer.

Figure 1:
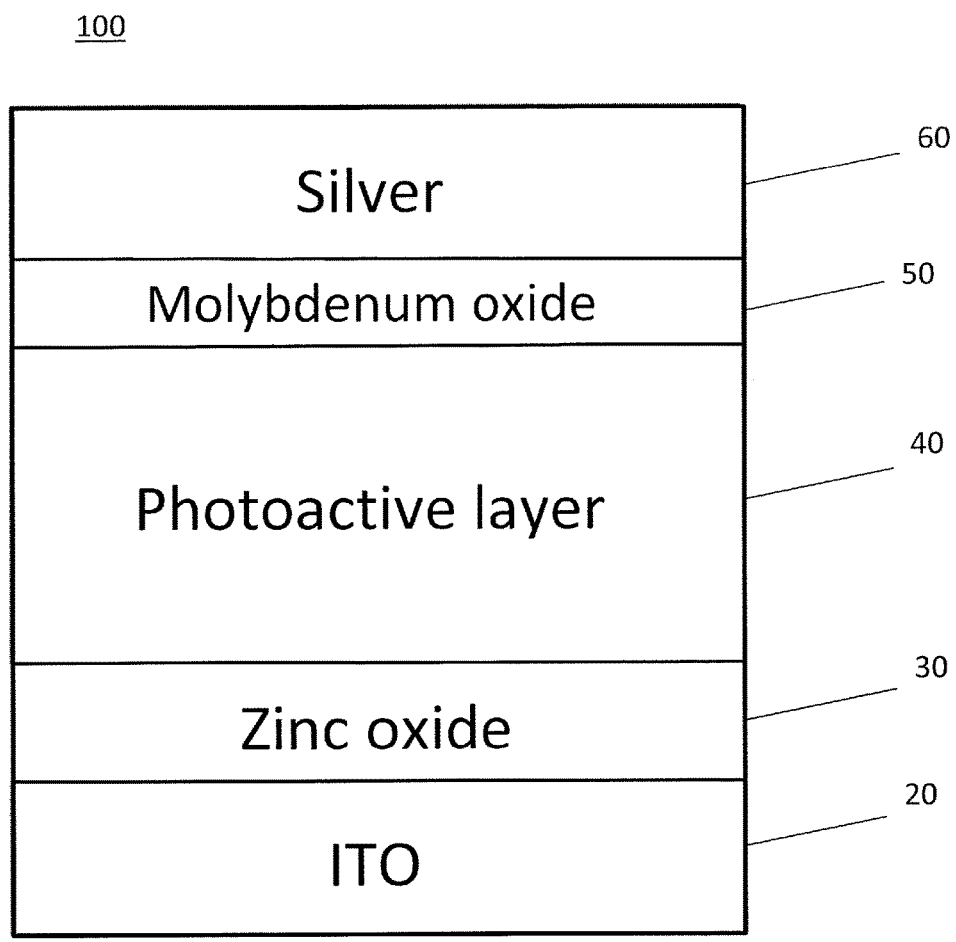
FIG. 1 shows a cross-sectional view of a photovoltaic cell according to an embodiment of the subject invention.

Referring to FIG. 1, in an embodiment, a photovoltaic cell 100 can include a first electrode 20, an ETL 30, a photoactive layer 40, a hole transporting layer (HTL) 50, and a second electrode 60. The first electrode 20 can be a cathode, and the second electrode 60 can be an anode, though embodiments are not limited thereto. In a particular embodiment, the first electrode 20 can be a bottom cathode, and the second electrode 60 can be a top anode, such that when the photovoltaic cell is in use, the photovoltaic cell has an inverted configuration. Light can enter the photovoltaic cell 100 from, for example, the bottom of FIG. 1, such that it goes through the first electrode 20, though embodiments are not limited thereto. Though certain materials are listed in FIG. 1, embodiments of the subject invention are not limited thereto.

Though not shown in FIG. 1, the photovoltaic cell 100 can further include a substrate such that the first electrode 20 is on the substrate. In various embodiments, the substrate can be flexible or rigid. In an alternative embodiment, no substrate is present and the first electrode 20 can also function as a substrate.

The first electrode 20 can include one or more of the following materials: indium tin oxide (ITO), indium zinc oxide (IZO), aluminum tin oxide (ATO), aluminum zinc oxide (AZO), a transparent conducting polymer, carbon nanotubes, silver nanowire, LiF/Al/ITO, Ag/ITO, and $CsCO_3$/ITO. In a particular embodiment, the first electrode 20 can be transparent to at least a portion of visible light; for example, the first electrode 20 can be a transparent conductive oxide (TCO), such as an ITO electrode. The second electrode 60 can include one or more of the following materials: ITO, IZO, ATO, AZO, silver, silver ink, silver particles, calcium, magnesium, gold, aluminum, carbon nanotubes, silver nanowire, LiF/Al/ITO, Ag/ITO, and $CsCO_3$/ITO. In an embodiment, the second electrode 60 can be transparent to at least a portion of visible light. In a particular embodiment, the second electrode 60 can be a silver electrode or an aluminum electrode.

The ETL 30 can include one or more of the following materials: a metal oxide such as titanium dioxide ($TiO_2$) or zinc oxide (ZnO), a metal oxide-polymer composite such as a ZnO-polymer composite or a $TiO_2$-polymer composite, and polyvinylpyrollidone (PVP). For example, the ETL 30 can be a ZnO-PVP composite, such as a ZnO-PVP nanocomposite (including nanoparticles). In a particular embodiment, the ETL 30 can be a ZnO-PVP nanocomposite formed by baking a coated mixture of zinc acetate and PVP in ethanol and/or ethanolamine.

The HTL 50 can include one or more of the following materials: molybdenum and a metal oxide such as molybdenum oxide. For example, the HTL 50 can be thermal-evaporated molybdenum oxide or solution-processed molybdenum oxide.

The photoactive layer 40 can include one or more of the following materials: poly(dithienogermole)-thienopyrrolodione (PDTG-TPD), poly(distannyl-dithienogermole)-thienopyrrolodione, poly(dithienosilole)-thienopyrrolodione (PDTS-TPD), (6,6)-phenyl-C71-butyric acid methyl ester (PC71BM), poly[4,8-bis-substituted-benzo[1,2-b:4,5-b]dithiophene-2,6-diyl-alt-4-substituted-thieno[3,4-b]thiophene-2,6-diyl] (PBDTTT), PDTG-TPD:PC71BM, PDTS-TPD:PC71BM, poly(distannyl-dithienogermole)-thienopyrrolodione:PC71BM, dithienogermole-thienopyrrolodione (DTG-TPD), dithienosilole-thienopyrrolodione (DTS-TPD), and copper indium gallium (di)selenide (CIGS). In a particular embodiment, the photoactive layer 40 can include a polymer and a fullerene. In another embodiment, the polymer of the photoactive layer can have a deep highest occupied molecular orbital (HOMO) energy of more than 5.3 eV. For example, the photoactive layer 40 can be PDTG-TPD:PC71BM or PDTS-TPD:PC71BM.

In embodiments of the subject invention, exciton generation can occur when light is incident on the photovoltaic cell 100, for example, upon solar illumination. Electrons and holes can be collected by the ETL 30 and the HTL 50, respectively.

In many embodiments, the ETL 30 can be UVO-treated. That is, during fabrication of the photovoltaic cell 100, after depositing the ETL 30, the ETL 30 can be UVO-treated before deposition of the next layer on the ETL 30 (e.g., the photoactive layer 40). In a particular embodiment, the ETL 30 can be a UVO-treated ZnO-PVP nanocomposite formed by baking a coated mixture of zinc acetate and PVP in ethanol and/or ethanolamine and then providing UVO treatment.

Treating the ETL with UVO can result in advantageous properties compared to an ETL that is not UVO-treated. For example, UVO treatment can passivate the defects in the ETL, for example, in ZnO nanoparticles. In addition, in a ZnO-PVP nanocomposite ETL, UVO treatment can help remove some or all of the PVP-rich layer from the surface of the film, thereby exposing the ZnO nanoclusters to the film surface. The defects in ZnO present before UVO treatment can serve as recombination centers which result in significant photocurrent loss. Also, the insufficient contact between the photoactive layer and the ZnO (which occurs when the PVP-rich layer dominates the surface of the ETL film) can retard charge collection. Upon UVO treatment, a photovoltaic cell shows an increase in short circuit current and fill factor. For example, a photovoltaic cell with UVO treatment of the ETL can show an increase of about 10% in short circuit current and an increase of about 5% in fill factor compared to a similar photovoltaic cell with an ETL that has not been UVO treated.

Figure 2A:
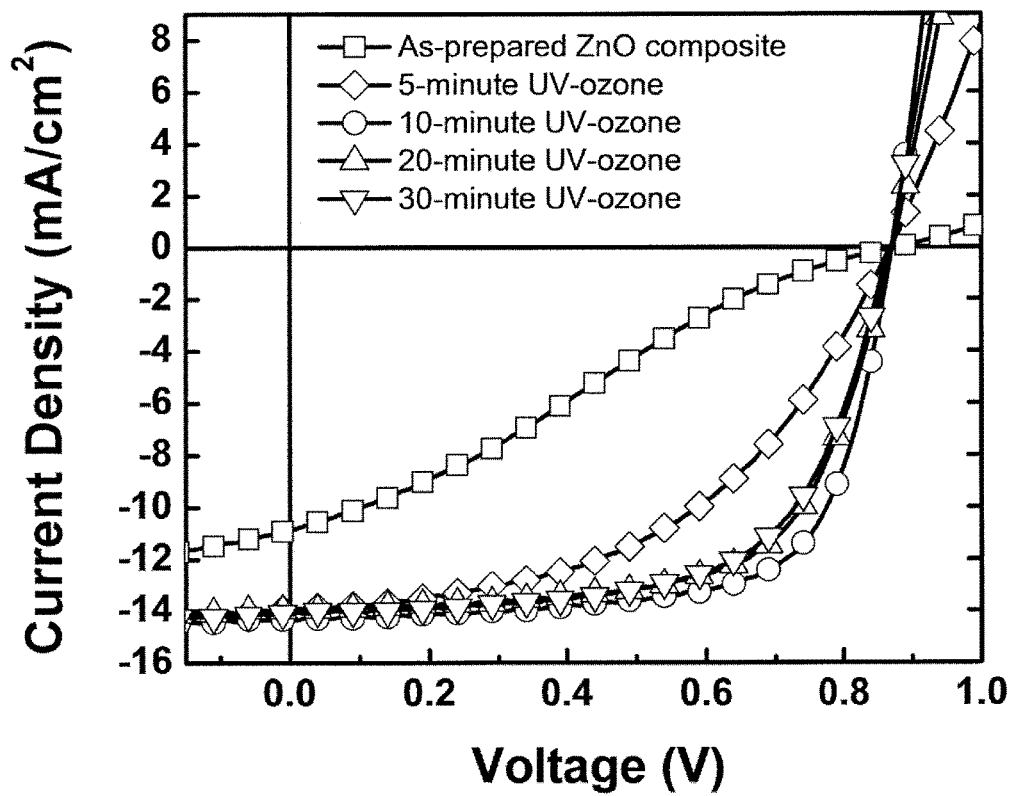
FIG. 2a shows current-voltage characteristics for photovoltaic cells according to embodiments of the subject invention.
Figure 2B:
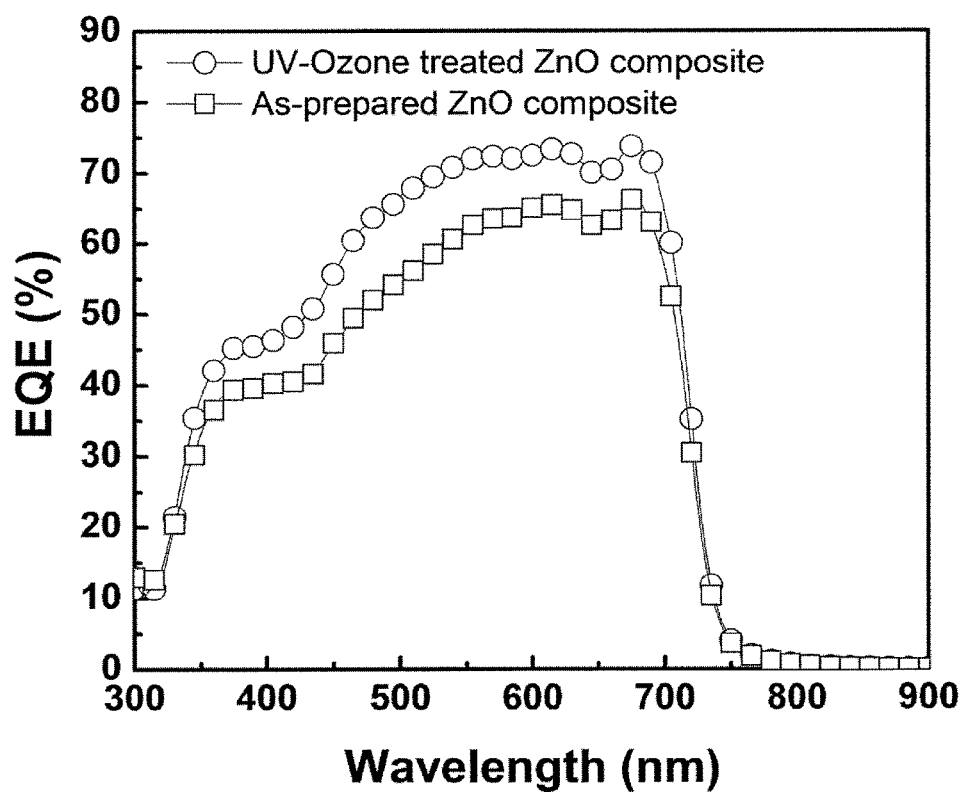
FIG. 2b shows external quantum efficiency spectra for photovoltaic cells according to embodiments of the subject invention.

FIG. 2a shows the current-voltage characteristics for photovoltaic cells having a non-UVO-treated ZnO-PVP nanocomposite ETL and a UVO-treated ZnO-PVP nanocomposite ETL (with UVO treatment for four different lengths of time). FIG. 2b shows the external quantum efficiency (EQE) spectra for photovoltaic cells having a non-UVO-treated ZnO-PVP nanocomposite ETL and a 10-minute UVO-treated ZnO-PVP nanocomposite ETL. An enhanced efficiency is observed through the full spectral range from 350-700 nm for photovoltaic cells with the UVO-treated ZnO-PVP nanocomposite films compared to cells without UVO treatment.

Polymer bulk heterojunction (BHJ) photovoltaic cells, such as those of the subject invention, are advantageous due to their potential for low-cost energy harvesting. Donor polymers which provide enhanced open-circuit voltage (Voc), light absorption, and high short circuit currents when blended with fullerenes can be used. For example, the Voc of BHJ polymer photovoltaic cells using low band-gap polymers such as PBDTTT can be tuned by incorporating stronger electron-withdrawing groups onto the polymer backbone to lower the highest occupied molecular orbital (HOMO) energy (Chen et al., *Nature Photon*, 2009). Inverted PDTG-TPD:PC71BM photovoltaic cells show higher short-circuit current density (Jsc) and fill factor (FF) compared to devices with an analogous polydithienosilole containing polymer (e.g., PDTS-TPD), leading to inverted polymer photovoltaic cells with power conversion efficiencies (PCEs) of 7.3%.

In a conventional BHJ polymer photovoltaic cell, holes are extracted to the bottom ITO anode and electrons are extracted to the top cathode. Poly(ethylenedioxythiophene)

doped with poly(styrene-sulfonate) (PEDOT:PSS) can be used as the anode interlayer. However, the use of acidic PEDOT:PSS in contact with the ITO electrode can be problematic since the ITO electrode is etched and degraded by PEDOT:PSS during processing. To facilitate electron extraction, a reactive low work-function metal such as LiF/Al can be used as a top electrode. The use of low work function metals as a cathode can give rise to device stability problems in polymer photovoltaic cells due to oxidation of the electrode when exposed to air. The inverted device geometry differs from the conventional geometry in that the bottom electrode (e.g., ITO) is used as the cathode and the top electrode (e.g., a metal electrode) is used as the anode. In an embodiment of the subject invention, the first electrode can be an ITO cathode, and the ETL on the ITO cathode can be a metal oxide, which can include, for example, ZnO or $TiO_2$. A thin transition metal oxide film, for example, molybdenum oxide can be the HTL under the second electrode, and the second electrode can be a metal anode. The use of transition metal oxides like molybdenum oxide along with Ag or Al as an anode contact has an additional advantage of enhanced hole extraction compared with the conventional PEDOT:PSS contact. One benefit of this inverted device geometry is its compatibility with large-scale R2R processing methods for ease of processing and improved device stability.

In an embodiment, a photovoltaic cell can have an inverted device geometry including a solution-processed or sputtered metal oxide ETL. ZnO can be included in the ETL and has high electron mobility and high optical transparency. Numerous methods can be employed to synthesize ZnO colloidal nanoparticle (NP) films or ZnO sol-gel processed films from various precursors. Some challenges in fabricating ZnO NP films or ZnO sol-gel films can include poor spatial distribution of nanoparticles and the need for surface passivation of ZnO due to the presence of defects. These issues, if not addressed, can lead to inconsistent device performance and low yields in an inverted BHJ photovoltaic cell. Thus, the UVO treatment which passivates the ZnO NP or ZnO sol-gel films without aggregation is critical to the realization of high efficiency inverted polymer photovoltaic cells.

In an embodiment, the ETL can be a ZnO-PVP composite sol-gel film or a ZnO-PVP nanocomposite. The composite film can include ZnO nanoclusters whose growth is mediated by a PVP polymeric matrix. ZnO-PVP nanocomposite films have the following advantages over conventional ZnO sol-gel films: (a) The ZnO nanocluster size and its concentration can be tuned by controlling the $Zn^{2+}$/PVP ratio; (b) the distribution of ZnO nanoclusters in the PVP polymer is uniform as compared to aggregation observed in ZnO sol-gel films without PVP; and (c) PVP capping molecules reduce defects in ZnO nanoclusters. PVP can passivate the ZnO nanoclusters and improve the film-forming capability of ZnO-PVP nanocomposite films. Also, because the sol-gel processing for the ZnO-PVP nanocomposite can be performed in air, this approach to depositing the ZnO ETLs is advantageously compatible with large-scale R2R processes.

In many embodiments, charge collection efficiency can be improved in an inverted PDTG-TPD bulk heterojunction photovoltaic cell using a ZnO-PVP nanocomposite film as the electron transport layer to attain organic polymer photovoltaic cells with AM1.5 PCE in excess of 8%. The use of PVP as an organic capping molecule and polymeric matrix for ZnO can give electron-transporting nanocomposite films with excellent film-forming characteristics. UVO treatment can remove PVP from the surface of the film and consequently expose the ZnO nanoclusters to the film surface. Using a UVO-treated ZnO-PVP nanocomposite ETL, inverted PDTG-TPD (or PDTS-TPD) photovoltaic cells can have a PCE of higher than 8%. This is due at least in part to improved charge collection by the nanocomposite film. This approach for fabricating highly-efficient inverted polymer photovoltaic cells can advantageously be applied in large-scale roll-to-roll (R2R) device fabrication.

In an embodiment, a method of fabricating a photovoltaic cell can include: forming an ETL on a first electrode; forming a photoactive layer on the ETL; forming an HTL on the photoactive layer; and forming a second electrode on the HTL. The first electrode can be a cathode, and the second electrode can be an anode, though embodiments are not limited thereto. In a particular embodiment, the first electrode can be a bottom cathode, and the second electrode can be a top anode, such that when the photovoltaic cell is in use, the photovoltaic cell has an inverted configuration. Light can enter the photovoltaic cell such that it goes through the first electrode, though embodiments are not limited thereto.

In an embodiment, the method can further include providing a substrate and forming the first electrode on the substrate. In various embodiments, the substrate can be flexible or rigid. In an alternative embodiment, no substrate is present and the first electrode can also function as a substrate.

The first electrode can include one or more of the following materials: ITO, IZO, ATO, AZO, silver, calcium, magnesium, gold, aluminum, carbon nanotubes, silver nanowire, LiF/Al/ITO, Ag/ITO, and $CsCO_3$/ITO. In a particular embodiment, the first electrode can be transparent to at least a portion of visible light; for example, the first electrode can be a TCO, such as an ITO electrode. The second electrode can include one or more of the following materials: ITO, IZO, ATO, AZO, silver, calcium, magnesium, gold, aluminum, carbon nanotubes, silver nanowire, LiF/Al/ITO, Ag/ITO, and $CsCO_3$/ITO. In a particular embodiment, the second electrode can be a silver electrode or an aluminum electrode.

The ETL can include one or more of the following materials: a metal oxide such as $TiO_2$ or ZnO, a metal oxide-polymer composite such as a ZnO-polymer composite or a $TiO_2$-polymer composite, and polyvinylpyrollidone (PVP). For example, the ETL can be a ZnO-PVP composite, such as a ZnO-PVP nanocomposite (including nanoparticles). In an embodiment, the ETL can include a metal oxide, and the metal oxide can be deposited by solution processing or sputtering. In a particular embodiment, the ETL can be a ZnO-PVP nanocomposite, and forming the ETL can include baking a coated mixture of zinc acetate and PVP in ethanol and/or ethanolamine.

The HTL can include one or more of the following materials: molybdenum and a metal oxide such as molybdenum oxide. In an embodiment, forming the HTL can include thermally evaporating or solution processing the HTL. For example, the HTL can be thermal-evaporated molybdenum oxide or solution-processed molybdenum oxide.

The photoactive layer can include one or more of the following materials: PDTG-TPD, poly(distannyl-dithienogermole)-thienopyrrolodione, PDTS-TPD, PC71BM, PBDTTT, PDTG-TPD:PC71BM, PDTS-TPD:PC71BM, poly(distannyl-dithienogermole)-thienopyrrolodione: PC71BM, DTG-TPD, DTS-TPD, and CIGS. In a particular embodiment, the photoactive layer can include a polymer and a fullerene. For example, the photoactive layer can be PDTG-TPD:PC71BM or PDTS-TPD:PC71BM. The photoactive layer can be deposited by, for example, sputtering, co-evaporation, and/or solution processing.

In many embodiments, the ETL can be UVO-treated. That is, during fabrication of the photovoltaic cell, after depositing the ETL, the ETL can be UVO-treated before deposition of the next layer on the ETL (e.g., the photoactive layer). In a particular embodiment, the ETL can be a UVO-treated ZnO-PVP nanocomposite and can be formed by baking a coated mixture of zinc acetate and PVP in ethanol and/or ethanolamine and then providing UVO treatment.

Embodiments of the subject invention are also drawn to methods of using a photovoltaic cell to capture light energy (e.g., solar energy). The photovoltaic cell can be as described herein.

MATERIALS AND METHODS

The detailed synthesis, polymer characterization, and photoactive layer fabrication and testing for PDTG-TPD:PC71BM and PDTS-TPD:PC71BM were done as reported in Amb et al. (2011). PC71BM used for OPV cell fabrication was purchased from Solenne. Polymers and PC71BM were dissolved in chlorobenzene with 1:1.5 (8 mg mL-1:12 mg mL-1) weight ratio and 5% volume ratio of 1,8-diiodooctane (DIO) was added as a processing additive prior to use. The ZnO-PVP nanocomposite was prepared from a precursor, in which zinc acetate dihydrate ($Zn(CH_3COO)_2 \cdot 2H_2O$, Aldrich, 99.9%, 110 mg) and polyvinylpyrollidone (PVP, 25 mg) were dissolved in 10 mL of ethanol. Ethanolamine was added to the precursor as a stabilizer in equal molar concentration to zinc acetate dihydrate. The ZnO-PVP precursor was spin-coated on indium tin oxide (ITO)-coated glass substrates, which were first cleaned with detergent, ultrasonicated in water, acetone, and isopropyl alcohol, and subsequently dried via N2 gun. The films were annealed at 200° C. for 40 minutes in air. After annealing and slow-cooling to room temperature, the ZnO-PVP composite films were UVO treated using a UVO cleaner. The film thicknesses for the ZnO-PVP composite film before and after UVO treatment were 36 nm and 33 nm, respectively. The polymer-fullerene solutions were then spin-coated and the resulting film with thickness of 110 nm was annealed at 80° C. for 30 minutes. Finally, thin films of $MoO_3$ (10 nm) and Ag (100 nm) were deposited through shadow masks via thermal evaporation. The active area of the device was 4.6 $mm^2$. For PV measurements, a light mask with an area of 3.04 $mm^2$ was used to define the active area of the device. Device characterization was carried out in air after encapsulation using an Air Mass 1.5 Global (A.M. 1.5G) solar simulator with irradiation intensity of 100 $mW/cm^2$. The EQE spectra for the inverted polymer photovoltaic cells were measured on an EQE measuring system and are shown in FIG. 2b.

All patents, patent applications, provisional applications, and publications referred to or cited herein (or in the references section) are incorporated by reference in their entirety, including all figures and tables, to the extent they are not inconsistent with the explicit teachings of this specification.

Following are examples that illustrate procedures for practicing the invention. These examples should not be construed as limiting. All percentages are by weight and all solvent mixture proportions are by volume unless otherwise noted.

Example 1

A photovoltaic cell was fabricated using ITO as the first electrode (cathode), ZnO-PVP nanocomposite as the electron transporting layer (ETL), PDTG-TPD:PC71BM as the photoactive layer, molybdenum oxide as the hole transporting layer (HTL), and silver as the second electrode (anode). Despite the advantages of improved spatial distribution and passivation of ZnO nanoclusters, which the addition of PVP provides to the ZnO sol-gel film, PVP is an insulating polymer that can hinder the charge collection in the inverted photovoltaic cells due to poor electronic coupling between the ZnO nanoclusters within the nanocomposite and PC71BM in the active layer. In order to ensure a good contact between the ZnO nanoclusters and PC71BM, ultraviolet-ozone (UVO) treatment was performed on the ZnO-PVP nanocomposite films, before forming the photoactive layer, to remove PVP from the surface. UVO treatment can remove PVP without significantly altering the size, shape, or spatial distribution of the nanoclusters films.

The photo J-V characteristics for inverted PDTG-TPD:PC71BM photovoltaic cells were measured with an A.M. 1.5G solar simulator as the light source. FIG. 2a shows the current-voltage characteristics for photovoltaic cells having a non-UVO-treated ZnO-PVP nanocomposite ETL and a UVO-treated ZnO-PVP nanocomposite ETL (with UVO treatment for four different lengths of time). The inverted photovoltaic cells with the as-prepared (non-UVO-treated) ZnO-PVP nanocomposite showed a low FF of 25.5% and Jsc of 10.9 mA/cm2. The poor FF in the cells without UVO treatment can be attributed to the presence of PVP on the surface of the nanocomposite film. As expected, the insulating PVP polymer hinders the electronic coupling between the ZnO nanoclusters in the nanocomposite film and PC71BM in the active layer, thus limiting the charge collection of the photogenerated electrons in the cells. The ZnO-PVP nanocomposite films were subsequently UVO treated for 5, 10, 20, and 30 minutes yielding significant enhancements in Jsc and FF for the inverted PDTG-TPD:PC71BM photovoltaic cells compared to cells with as-prepared nanocomposite films.

Table 1 summarizes the device performance for inverted photovoltaic cells with, and without, the UVO-treated ZnO-PVP nanocomposite films. UVO treating the ZnO-PVP nanocomposite films for 10 minutes led to an optimal device with a 29.4% enhancement in Jsc and an enhancement in the FF by 2.7 times resulting in an average power conversion efficiency of 8.1%. The average PCE of 8.1+/−0.4% is based on the measurement results from over 100 photovoltaic cells fabricated. The optimal device had a Jsc of 14.4 $mA/cm^2$, a Voc of 0.86 V, a FF of 68.8%, and a PCE of 8.5%. For devices with ZnO-PVP composite films that have been UVO treated below or above 10 minutes, a reduction in FF was observed. This reduction in FF may be due to PVP still present on the surface of the composite film if the UV-ozone treatment time is too short, or excess oxygen present on the ZnO film surface which reduces the electron extraction efficiency when the treatment time is too long. The removal of PVP from the ZnO-PVP nanocomposite film surface by UVO treatment greatly enhances the charge collection efficiency in photovoltaic cells.

TABLE 1

Averaged photovoltaic cell performance for inverted PDTG-TPD: PC71BM devices
with as-prepared or 5, 10, 20, 30-minute UVO-treated ZnO-PVP composite ETLs.

| UV-ozone treatment time | $J_{sc}$ (mA cm$^{-2}$) | $V_{oc}$ (V) | FF (%) | Average PCE (%) | Best PCE (%) |
| --- | --- | --- | --- | --- | --- |
| As-prepared | 10.9 +/− 0.2 | 0.86 +/− 0.003 | 25.5 +/− 0.8 | 2.4 +/− 0.2 | 2.6 |
| 5-min. UV-ozone | 13.9 +/− 0.1 | 0.85 +/− 0.005 | 56.0 +/− 3.8 | 6.6 +/− 0.5 | 7.1 |
| 10-min. UV-ozone | 14.0 +/− 0.4 | 0.86 +/− 0.003 | 67.3 +/− 1.5 | 8.1 +/− 0.4 | 8.5 |
| 20-min. UV-ozone | 14.1 +/− 0.2 | 0.86 +/− 0.003 | 64.8 +/− 0.8 | 7.8 +/− 0.2 | 8.0 |
| 30-min. UV-ozone | 14.0 +/− 0.1 | 0.86 +/− 0.003 | 61.9 +/− 1.6 | 7.5 +/− 0.3 | 7.6 |

FIG. 2b shows the external quantum efficiency (EQE) spectra for photovoltaic cells having a non-UVO-treated ZnO-PVP nanocomposite ETL and a 10-minute UVO-treated ZnO-PVP nanocomposite ETL. An enhanced efficiency is observed through the full spectral range from 350-700 nm for photovoltaic cells with the UVO-treated ZnO-PVP nanocomposite films compared to cells without UVO treatment. The maximum EQE for the optimized inverted photovoltaic cell with a UVO-treated nanocomposite ETL and a PDTG-TPD:PC71BM photoactive layer was 73.6%. The Jsc value was then calculated by integrating the EQE data with the A.M. 1.5G spectrum. The calculated Jsc value of 14.5 mA/cm$^2$ is in good agreement with the measured Jsc for the inverted photovoltaic cells.

Example 2

Figure 6A:
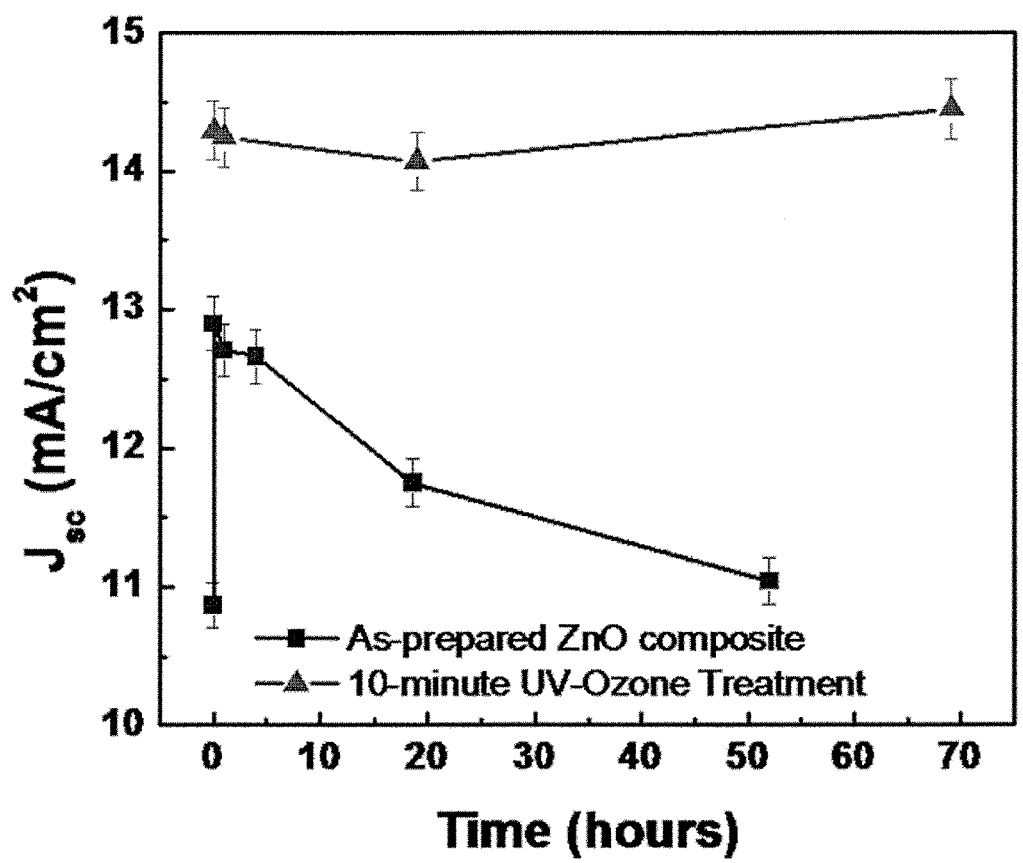
FIG. 6a shows a plot of current density vs. time for a photovoltaic cell according to an embodiment of the subject invention.
Figure 6B:
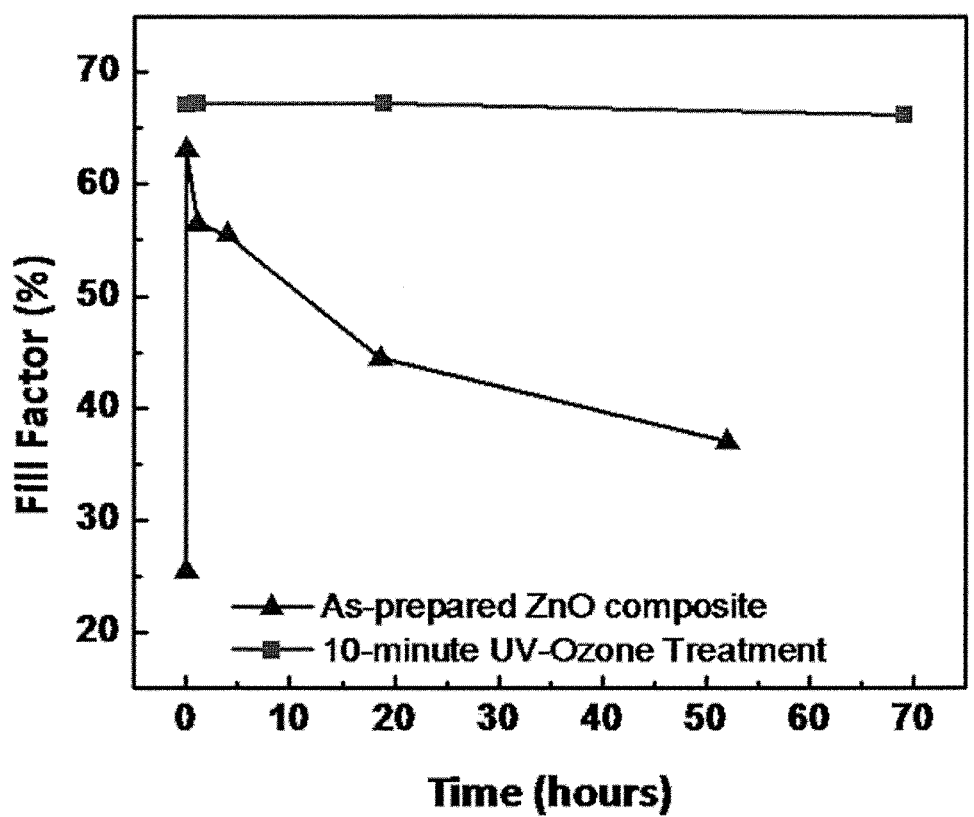
FIG. 6b shows a plot of fill factor vs. time for a photovoltaic cell according to an embodiment of the subject invention.
Figure 6C:
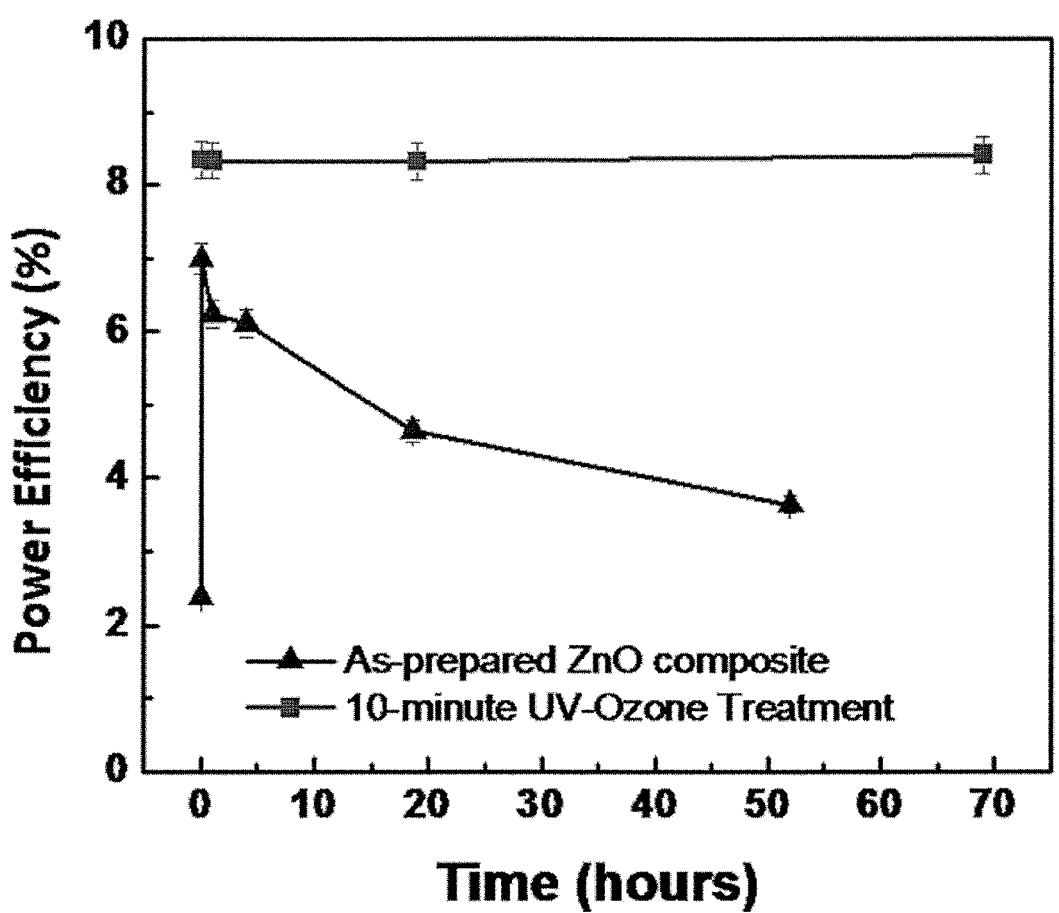
FIG. 6c shows a plot of power conversion efficiency vs. time for a photovoltaic cell according to an embodiment of the subject invention.

The stability of encapsulated inverted devices with as-prepared and UVO-treated ZnO-PVP nanocomposite films was investigated. FIGS. 6a-6c show the changes in the Jsc (FIG. 6a), FF (FIG. 6b), and PCE (FIG. 6c) over time for inverted PDTG-TPD:PC71BM photovoltaic cells with either untreated or UVO-treated ZnO-PVP nanocomposite ETLs. Devices with as-prepared nanocomposite films show low efficiencies initially, and additional light exposure is required to achieve optimum device performance. This light-soaking required to obtain optimum device performance has been reported by Krebs (Org. Elec. 10, 761-768, 2009). For example, without the UVO treatment, the initial FF was only 25.5%, and its value increased to 63.7% upon 10 minutes of light soaking. On the other hand, UVO-treated devices do not require light soaking. To study the device stability of the cell without UV-ozone treatment, the cell was given a 10-minute light soak before subsequent PV measurements. For the devices with UVO treatment, the PV measurements were carried out without any light soaking at all. Referring to FIGS. 6a-6c, after light soaking, the performance of the device with untreated ZnO-PVP nanocomposite ETL reduced significantly over time, showing that the enhancement in Jsc and FF due to light soaking was only temporary. In contrast, the device performance enhancement observed for photovoltaic cells with UVO-treated ZnO-PVP nanocomposite ETLs was stable over time. In fact, there were no measurable changes in Jsc, FF, and PCE over a period of 1 month provided that the encapsulated devices are stored in a nitrogen glove box. Thus, UVO treatment of the ZnO-PVP nanocomposite films provides a permanent enhancement to the inverted photovoltaic cells.

Figure 3:
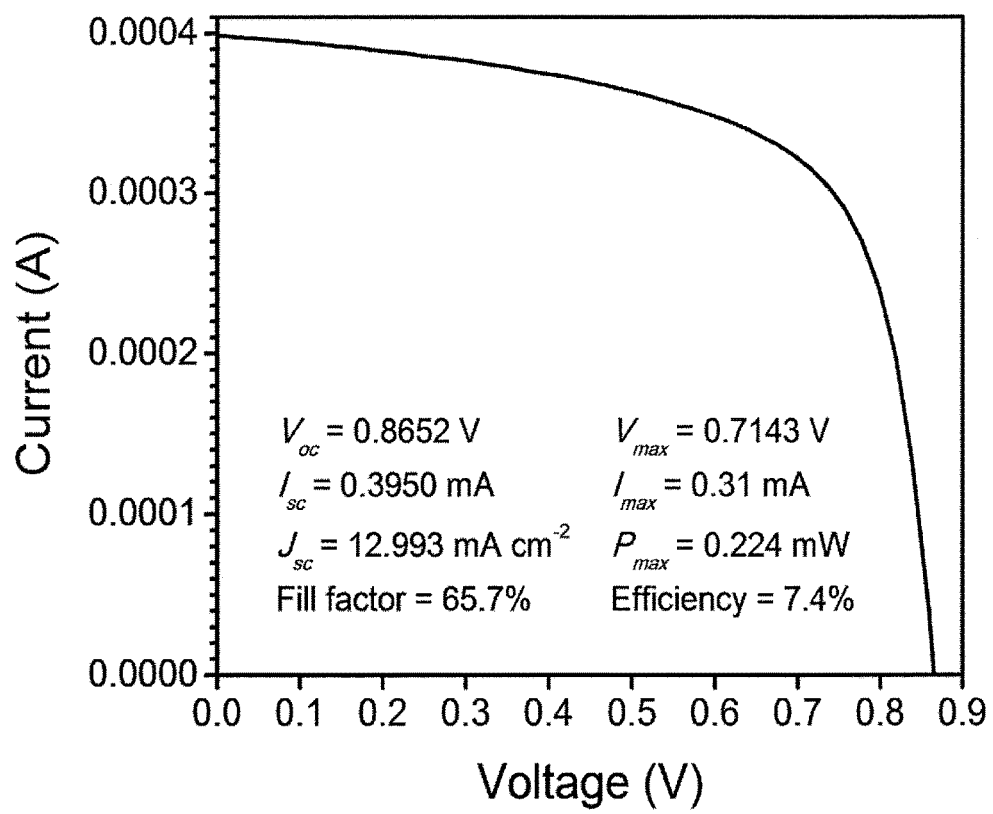
FIG. 3 shows photo J-V characteristics for a photovoltaic cell according to an embodiment of the subject invention.

Encapsulated devices with UVO-treated ZnO-PVP nanocomposite films were then sent to NEWPORT Corporation for certification. The photo J-V characteristics and corresponding photovoltaic cell parameters are shown in FIG. 3. A power conversion efficiency of 7.4+/−0.2% was certified for the devices. While this certified efficiency is about 10% less than the power conversion efficiency measured in our laboratory due to a reduction in Jsc and FF in the certified device, the reduction in power conversion efficiency in the certified cells can be attributed to degradation during transit from Florida to California because of the un-optimized encapsulation process. The devices were retested in our laboratory after certification and we confirmed the degradation of the cells due to encapsulation. For example, the average device performance for the certified cells a week after certification was as follows: Jsc=13.0 mA/cm$^2$, Voc=0.87 V, FF=63.1%, and PCE=7.2%

Example 3

Figure 4B:
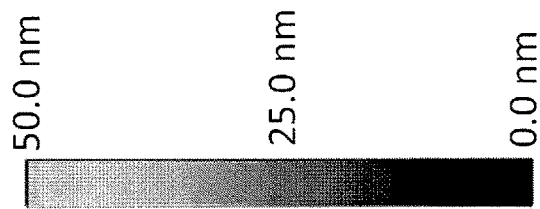
FIGS. 4a and 4b show 3-D surface topography images for films of photovoltaic cells according to embodiments of the subject invention.
Figure 4B:
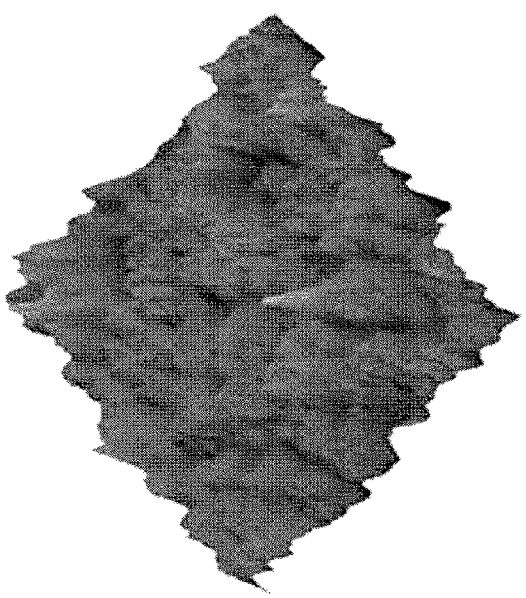
Figure 4A:
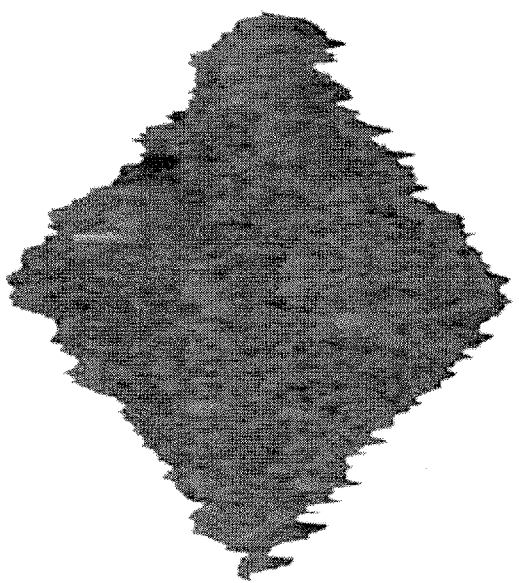
Figure 4C:
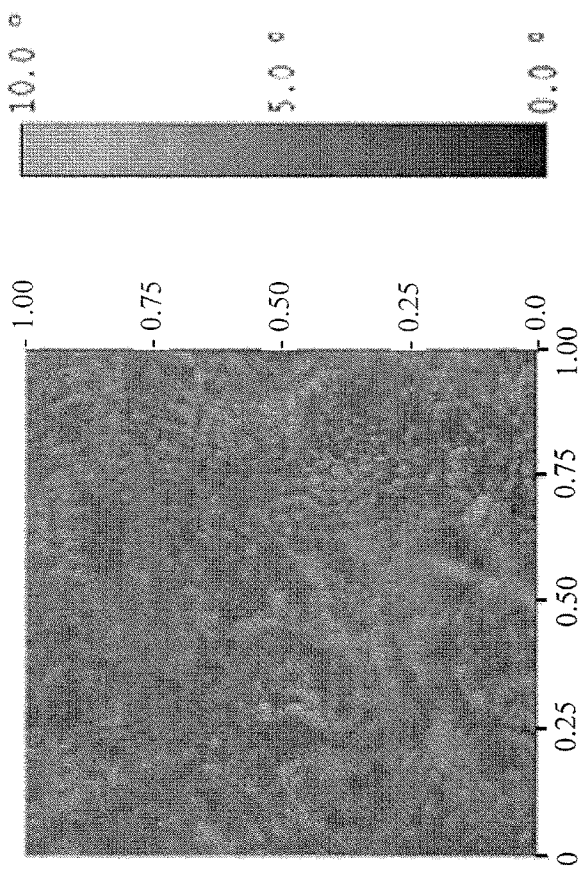
FIGS. 4c and 4d show phase images for films of photovoltaic cells according to embodiments of the subject invention.
Figure 4D:
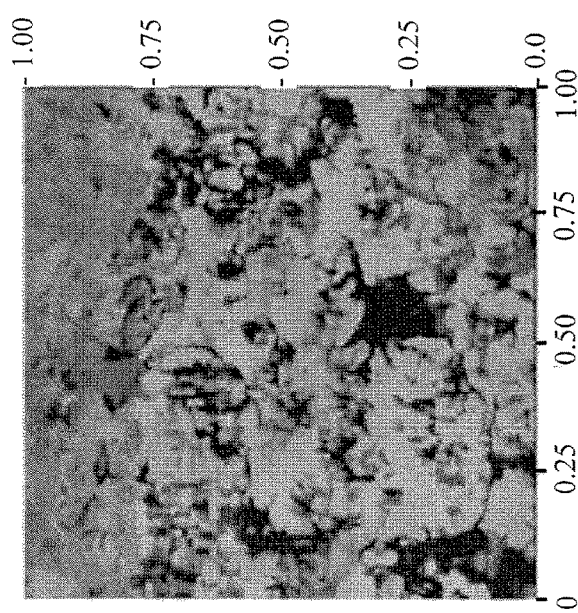
Figure 4E:
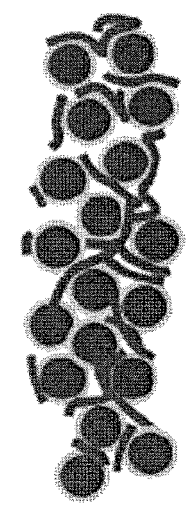
FIGS. 4e and 4f show schematics for films of photovoltaic cells according to embodiments of the subject invention.
Figure 4F:
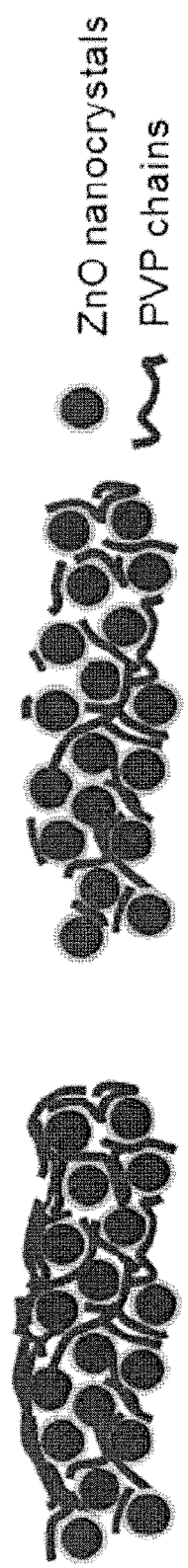

To study the nanoscale surface morphology of the as-prepared and UV-ozone treated ZnO-PVP nanocomposite films used in our inverted photovoltaic cells, tapping-mode atomic force microscopy (AFM) was performed after the sol-gel films were annealed in air. All AFM images were taken on the same substrates. FIGS. 4a and 4b show the 3-D surface topography images for nanocomposite film before and after UVO treatment, respectively. The ZnO-PVP nanocomposite film shows an increase in r.m.s. roughness from 7.07 nm to 9.18 nm upon UVO treatment, suggesting that, as PVP is removed during UVO treatment, the ZnO nanoclusters are exposed to the surface. The phase images for the same samples are shown in FIGS. 4c and 4d. For the nanocomposite film with no UVO treatment, no nanoclusters were observed indicating that the surface is covered by a thin layer of PVP. On the other hand, the phase image for the UVO-treated ZnO-PVP nanocomposite film shows that the PVP domain size has been reduced to 50-100 nm. Consequently, more ZnO nanoclusters are exposed on the surface. Thus, the removal of PVP by UVO treatment exposes the ZnO nanoclusters to the surface. The PVP-rich and ZnO nanocluster-rich surfaces for the nanocomposite films before and after UVO treatment are shown schematically in FIGS. 4e and 4f, respectively.

Figure 7A:
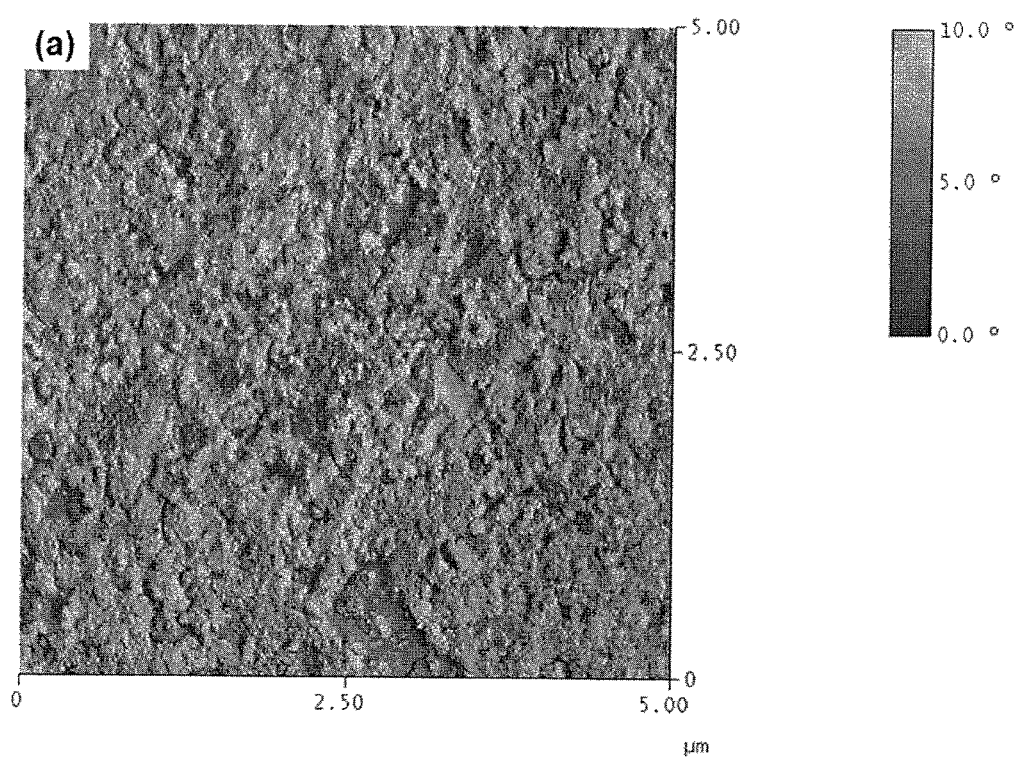
FIGS. 7a and 7b show 5 μm-scale phase images for films of photovoltaic cells according to embodiments of the subject invention.
Figure 7B:
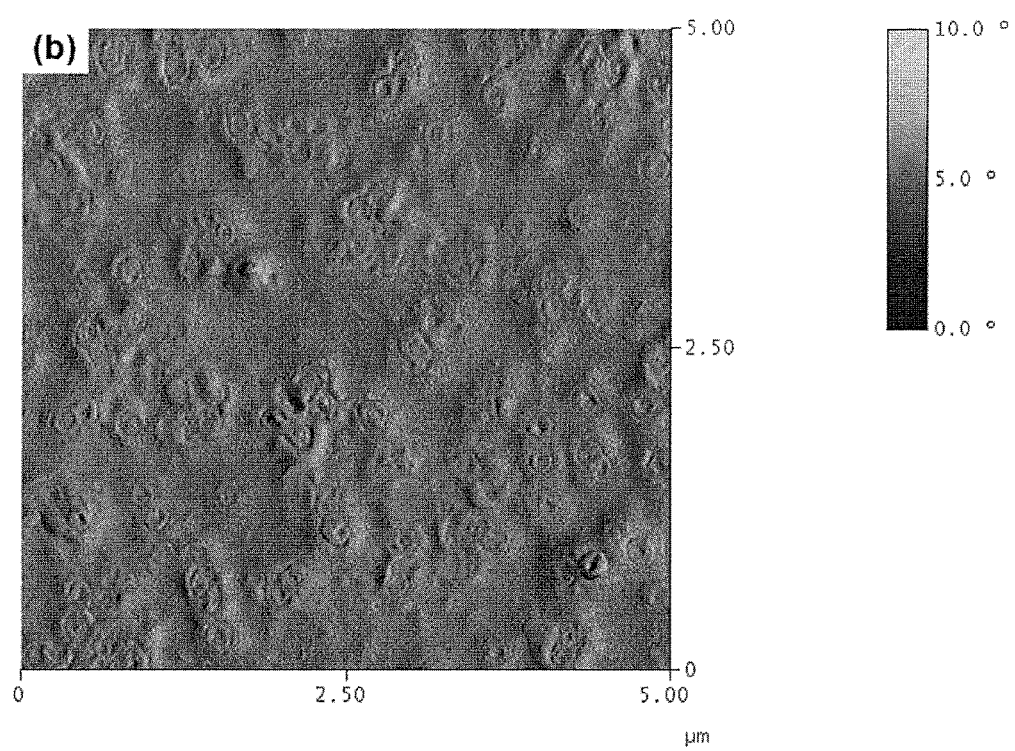

To investigate whether the removal of PVP from the nanocomposite film surface altered the film thickness, step-height measurements were performed for the films before and after UVO treatment. The average thickness of the nanocomposite film was reduced by about 10% after 10 minutes of UV ozone treatment, from 36 nm in the as-prepared nanocomposite to 33 nm in the treated nanocomposite film. This reduction in film thickness provides further evidence that PVP was removed upon UVO treatment of the ZnO-PVP nanocomposite film. To further illustrate the surface morphology for the ZnO-PVP nanocomposite films before and after UVO treatment, FIGS. 7a and 7b show 5 µm-scale phase images. Removal of PVP by UVO treatment significantly altered the surface morphology for the nanocomposite film. The change in the nanocomposite film surface morphology from being PVP-rich before UVO treatment to ZnO NP-rich after treatment supports the premise that the removal of PVP from the nanocomposite film by UVO treatment provides improved charge collection in an inverted polymer photovoltaic cell due to better electronic coupling between the ZnO nanoclusters within the nanocomposite film and PC71BM in the active layer.

Example 4

Figure 5A:
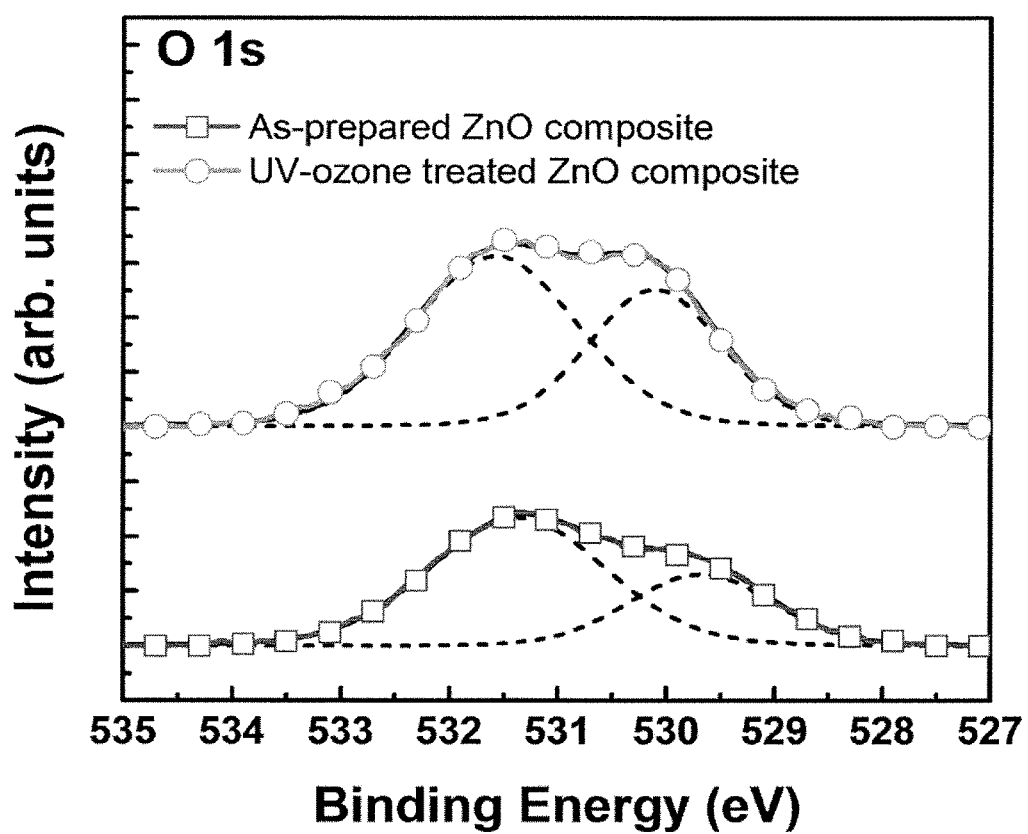
FIGS. 5a-5c show X-ray photoemission spectra (XPS) for films of photovoltaic cells according to embodiments of the subject invention.
Figure 5B:
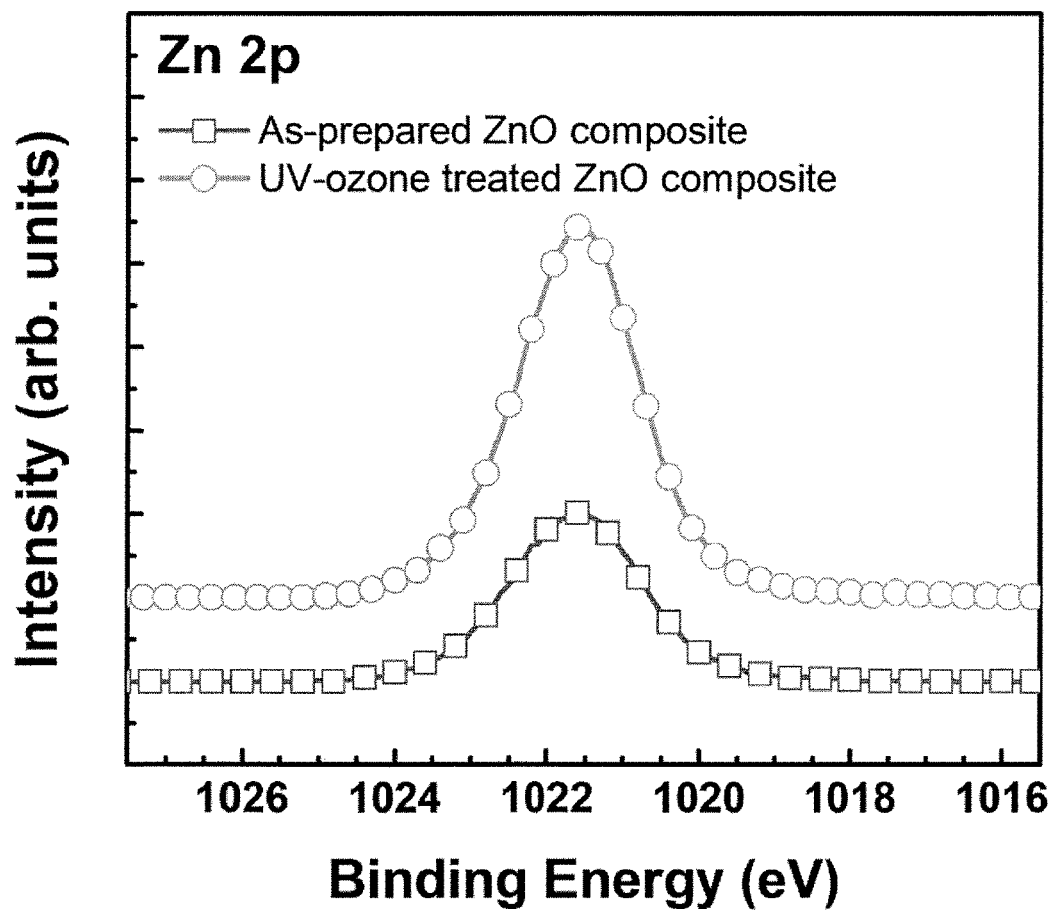

To investigate whether the compositional changes from the AFM data were truly due to the removal of PVP, X-ray photoemission spectroscopy (XPS) was performed on the ZnO-PVP nanocomposite films. Considering the UVO time required for the nanocomposite film to optimize the device performance, some changes in the chemical composition of ZnO might be plausible. The core level XPS spectra for the C 1s, O 1 s, and Zn 2p were measured for the as-prepared and 10-minute UVO-treated ZnO-PVP nanocomposite films. The binding energies were calibrated by taking the C is peak (284.6 eV) as a reference. The 0 is XPS spectra for as-prepared and the UVO-treated ZnO-PVP nanocomposite films are shown in FIG. 5a. UVO treatment increased the relative magnitude for the peak at 531.4 eV, which corresponds to the oxygen atoms bonded to Zn in the ZnO matrix, by about 37%. Thus the number of Zn—O bonds in the wurtzite structure of ZnO at the surface of the film is increased. UVO treatment also increased the relative magnitude for the peak at about 530.0 eV, which corresponds to $O^{-2}$ ions present in the porous ZnO clusters, but not chemically bonded to Zn in the ZnO wurtzite structure. FIG. 5b shows the Zn (2p3/2) XPS spectra for the as-prepared and UVO-treated ZnO-PVP nanocomposite films. The intensity of the peak at 1021.6 eV, which corresponds to the Zn—O bonds, increases after UVO treatment. These results are in agreement with the result from the O 1s XPS spectra. Based on the O 1s and Zn 2p XPS spectra, the chemical composition of ZnO nanoclusters on the surface of the nanocomposite film have become oxygen-rich after UVO treatment.

Figure 5C:
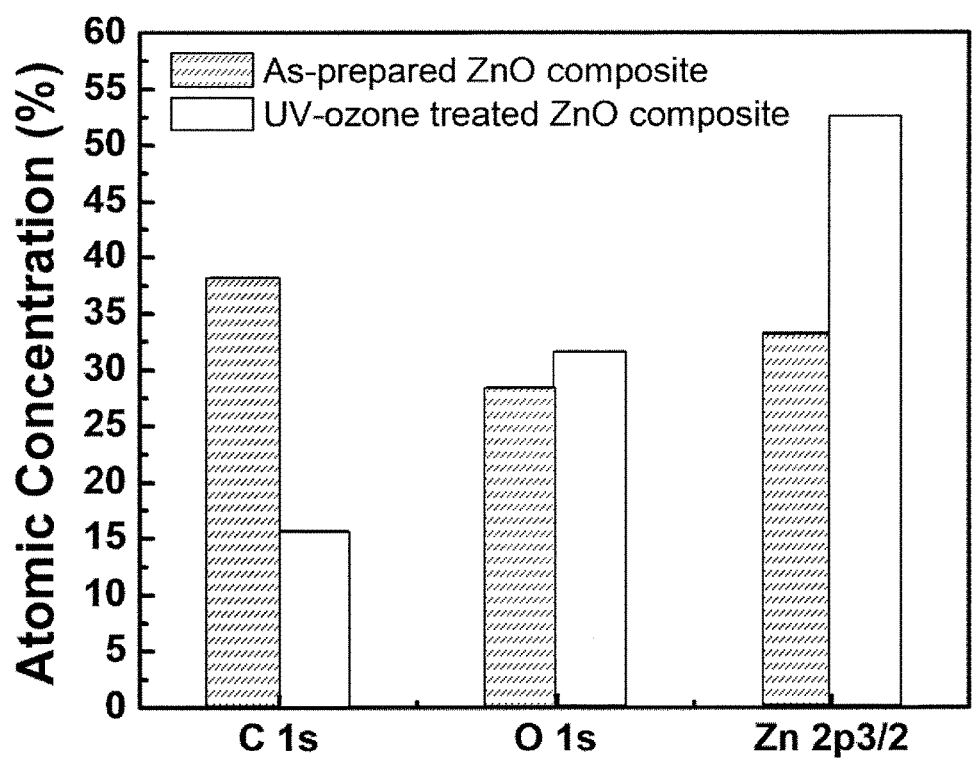

The atomic concentrations of C, O, and Zn for the as-prepared and 10-minute UVO-treated ZnO-PVP nanocomposite films based on the C 1s, O 1s, and Zn 2p XPS spectra are summarized in FIG. 5c. The atomic concentration of carbon from the PVP in the nanocomposite is significantly reduced by UVO treatment (from 38.2% to 15.7%). Conversely, the atomic concentrations of oxygen and zinc present in the nanocomposite film both increase from 28.5% and 33.3% for the untreated film to 31.6% and 52.6%, respectively, for the treated film. The relatively smaller increase in oxygen atomic concentration compared to Zn is due to the competition between the increases in oxygen content coming from UVO treatment versus the decrease in oxygen content coming from the removal of PVP. These results strongly support the assertion that UVO treatment removes PVP from the surface of the ZnO-PVP nanocomposite film.

Example 5

Figure 8:
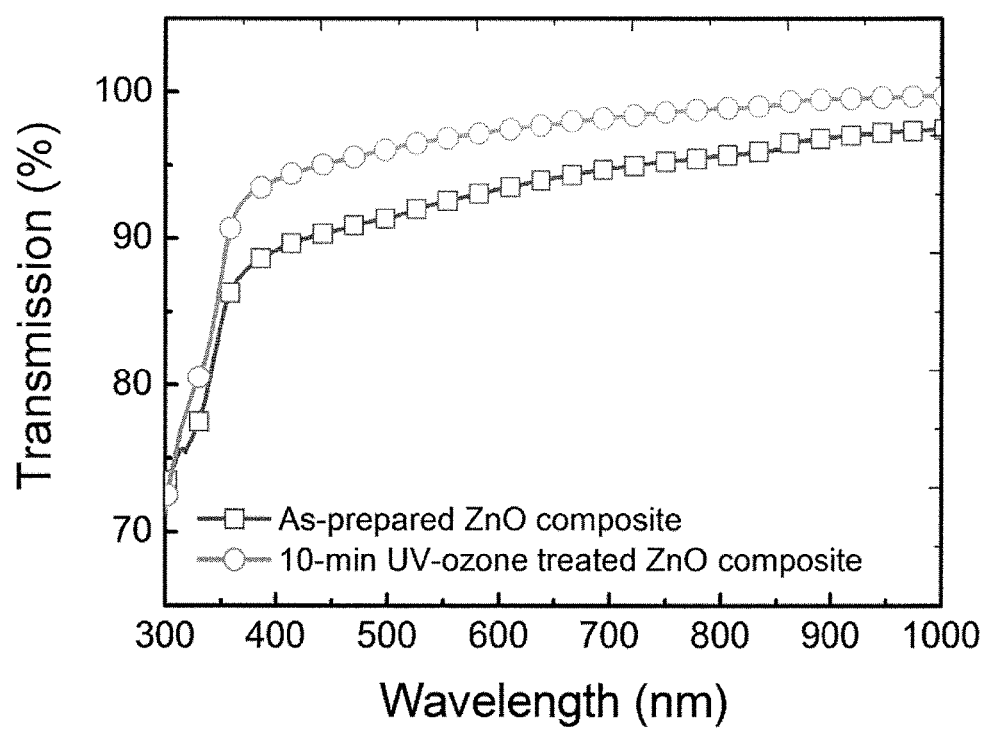
FIG. 8 shows UV-visible-NIR transmission spectra for films of photovoltaic cells according to embodiments of the subject invention.

The effect of UVO treatment on optical transmission for the as-prepared and treated ZnO-PVP nanocomposite films was considered. FIG. 8 shows UV-visible-NIR transmission spectra for these films. Upon UVO treatment, a 6% to 10% increase in transmission across the entire visible spectrum is observed in the nanocomposite film. This increase may be due to reduction of the film thickness and changes in the effective index of refraction of the nanocomposite film upon UVO treatment. The increase in optical transparency is less than the enhancement observed in Jsc for inverted photovoltaic cells with UVO-treated ZnO-PVP nanocomposite films. Therefore, while the increase in optical transparency contributes to the Jsc enhancement, the improved charge collection due to enhanced electronic coupling between ZnO nanoclusters in the nanocomposite film and PC71BM in the active layer is primarily responsible for this enhancement.

Example 6

The behavior of UVO-treated ZnO-PVP nanocomposite films on inverted BRJ photovoltaic cells was investigated using PDTS-TPD in the photoactive layer. Table 2 shows the device performance for inverted PDTS-TPD and PDTG-TPD BM photovoltaic cells with UVO-treated ZnO-PVP nanocomposite films as electron transport layer. The inverted PDTS-TPD:PC71BM cells show similar enhancements in FF and Jsc compared to the PDTG-TPD cells upon UVO treatment of the ZnO-PVP nanocomposite ETL, resulting in devices with an average PCE of 7.6%. In both the PDTG-TPD and PDTS-TPD cells, no reduction in Voc was observed in devices with treated nanocomposite films despite the fact that UVO treatment oxidized the film surface. Based on these results, this approach of UVO treating the ZnO-PVP nanocomposite ETL works very well for this family of polymers.

TABLE 2

Average device performance ($J_{sc}$, FF, $V_{oc}$) for PDTG-TPD and PDTS-TPD inverted photovoltaic cells with 10-minute UVO-treated ZnO-PVP composite film as the ETL.

|  | HOMO (eV) | $J_{sc}$(mA/cm$^2$) | $V_{oc}$(V) | FF (%) | PCE (%) |
|---|---|---|---|---|---|
| DTS-TPD | −5.65 | 12.9 | 0.90 | 65.4 | 7.6 |
| DTG-TPD | −5.60 | 14.0 | 0.86 | 67.3 | 8.1 |

It should be understood that the examples and embodiments described herein are for illustrative purposes only and that various modifications or changes in light thereof will be suggested to persons skilled in the art and are to be included within the spirit and purview of this application. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

REFERENCES

Li, G., Chu, C. W., Shrotriya, V., Huang, J., & Yang, Y., Efficient Inverted Polymer Solar Cells. *Appl. Phys. Lett.* 88, 253503 (2006).

Chen, L. M., Hong, Z. R., Li, G., & Yang, Y., Recent Progress in Polymer Solar Cells: Manipulation of Polymer: Fullerene Morphology and the Formation of Efficient Inverted Polymer Solar cells. *Adv. Mater.* 21, 1434-1449 (2009).

Chen, H. Y. et al., Polymer solar cells with Enhanced Open-Circuit Voltage and Efficiency. *Nature Photon.* 3, 649-653 (2009).

Amb, C. M. et al., Dithienogermole as a Fused Electron Donor in Bulk Heterojunction Solar Cells. *J. Am. Chem. Soc.* 133, 10062-10065 (2011).

Chu, T. Y. et al. Bulk Heterojunction Solar Cells Using Thieno[3,4-c]pyrrole-4,6-dione and Dithieno[3,2-b:2',3'-d]silole Copolymer with a Power Conversion Efficiency of 7.3%. *J. Am. Chem. Soc.* 12, 4250-4253 (2011).

Sun, Y. M., Seo, J. H., Takacs, C. J., Seifter, J., & Heeger, A. J., Inverted Polymer Solar Cells Integrated with a Low-Temperature-Annealed Sol-Gel-Derived ZnO Film as an Electron Transport Layer. *Adv. Mater.* 23, 1679-1683 (2011).

Kawano, K. et al., Degradation of Organic Solar Cells Due to Air Exposure. *Sol. Eng. Mater. Sol. Cells* 90, 3520-3530 (2006).

Jorgensen, M., Norrman, K., & Krebs, F. C., Stability/Degradation of Polymer Solar Cells. *Sol. Eng. Mater. Sol. Cells* 92, 686-714 (2008).

Norrman, K., Gevorgyan, S. A., & Krebs, F. C., Water-Induced Degradation of Polymer Solar Cells Studied by $H_2^{18}O$ Labeling. *ACS Appl. Mater. Interfaces* 1, 102-112 (2009).

Beaujuge, P., Subbiah, J., Choudhury, K. R., Ellinger, S., McCarley, T., So, F., & Reynolds, J. R., Green Dioxthiophene-Benzothiadiazole Donor-Acceptor Copolymers for Photovoltaic Device Applications. *Chem. Mater.* 22, 2093-2106 (2010).

Subbiah, J., Kim, D. Y., Hartel, M., & So, F. MoO3/poly(9,9-dioctylfluorene-co-N-[4-(3-methylpropyl)]-diphenylamine) Double Interlayer Effect on Polymer Photovoltaic Cells. *Appl. Phys. Lett.* 96, 063303 (2010).

Subbiah, J., Beaujuge, P., Choudhury, K. R., Chen, S., Reynolds, J. R., & So, F. Combined Effects of MoO3 Interlayer and $PC_{70}BM$ on Polymer Photovoltaic Device Performance. *Org. Elect.* 11, 955-958 (2010).

Kim, D. Y., Subbiah, J. Sarasqueta, G., Irfan, Gao, Y., & So, F. The Effect of Molybdenum Oxide Interlayer on Organic Photovoltaic Cells. *Appl. Phys. Lett.* 95, 093304 (2009).

Irfan et al., Energy Level Evolution of Molybdenum Trioxide Interlayer Between Indium Tin Oxide and Organic Semiconductor. *Appl. Phys. Lett.* 96, 073304 (2010).

Xu Z. et al., Vertical Phase Separation in Poly(3-hexylthiophene): Fullerene Derivative Blends and its Advantage for Inverted Structure Solar Cells. *Adv. Func. Mater.* 19, 1227-1234 (2009).

Krebs, F. C. Polymer Solar Cell Modules Prepared Using Roll-to-Roll Methods: Knife-Over-Edge Coating, Slot-Die Coating and Screen Printing. *Sol. Energy Mater. And Sol. Cells* 93, 465-475 (2009).

Krebs, F. C., Gevorgyan, S. A., & Alstrup, J. A Roll-to-Roll Process to Flexible Polymer Solar Cells: Model Studies, Manufacture and Operational Stability Studies. *J. Mater. Chem.* 19, 5442-5451 (2009).

Beek, W. J. E. et al., Hybrid Zinc Oxide Polymer Bulk Heterojunction Solar Cells. *J. Phys. Chem. B* 109, 9505-9516 (2005).

Hau, S. K., Yip, H.-L., Baek, N. S., Zou, J., O'Malley, K., & Jen, A. K. Y. Air-Stable Inverted Flexible Polymer Solar Cells Using Zinc Oxide Nanoparticles as an Electron Selective Layer. *Appl. Phys. Lett.* 92, 253301 (2008).

Cavaleri, J. J. et al., Femtosecond Study of the Size-Dependent Charge Carrier Dynamics in ZnO Nanocluster Solutions. *Chem. Phys.* 103, 5378-5386 (1995).

Sakohara, S. et al., Visible Luminescence and Surface Properties of Nanosized ZnO Colloids Prepared by Hydrolyzing Zinc Acetate. *J. Phys. Chem. B* 102, 10169-10175 (1998).

Monticone, S. et al., Complex Nature of the UV and Visible Fluorescence of Colloidal ZnO Nanoparticles. *J. Phys. Chem. B* 102, 2854-2862 (1998).

Guo, L., et al., Synthesis and Characterization of Poly (vinylpyrrolidone)-modified Zinc Oxide Nanoparticles. *Chem. Mater.* 12, 2268-2274 (2000).

Du, T. & Ilegbusi, O. J., Synthesis and Morphological Characterization on PVP/ZnO Nano Hybrid Films. *J. Mater. Sci.* 39, 6105-6109 (2004).

Du, T., Song, H., & Ilegbusi, O. J., Sol-Gel Derived ZnO/PVP Nanocomposite Thin Film for Superoxide Radical Sensor. *Mater. Sci. Eng. C* 27, 414-420 (2007).

Singla, M. L., et al., Optical Characterization of ZnO Nanoparticles Capped with Various Surfactants. *J. Lumin.* 129, 434-438 (2009).

Tang, H. et al., Gas Sensing Behavior of Polyvinylpyrrolidone-modified ZnO Nanoparticles for Trimethylamine. *Sens. Actuators B* 113, 324-328 (2006).

Aliaga, C. et al., Sum Frequency Generation and Catalytic Reaction Studies of the Removal of Organic Capping Agents from Pt Nanoparticles by UV-Ozone Treatment. *J. Phys. Chem. C* 113, 6150-6155 (2009).

Park, J. Y., Aliaga, C., Renzas, J. R., Lee, H., & Somorjai, G. A., The Role of Organic Capping Layers of Platinum Nanoparticles in Catalytic Activity of CO Oxidation. *Catal. Lett.* 129, 1-6 (2009).

Krebs, F. C., All Solution Roll-to-Roll Processed Polymer Solar Cells Free From Indium-Tin-Oxide and Vacuum Coating Steps. *Org. Elec.* 10, 761-768 (2009).

Zhang, Y. T. et al., X-ray Photoelectron Spectroscopy Study of ZnO Films Grown by Metal-organic Chemical Vapor Deposition. *J. Crystal Growth* 252, 180-183 (2003).

We claim:

1. A photovoltaic cell, comprising:
   a first electrode;
   an electron transporting layer,
   wherein the electron transporting layer comprises a metal-oxide-polymer composite;
   a photoactive layer;
   a hole transporting layer; and
   a second electrode,
   wherein the photovoltaic cell is fabricated by a method comprising:
      forming the electron transporting layer;
      performing ultraviolet-ozone treatment on the electron transporting layer; and
      forming the photoactive layer on a first surface of the electron transporting layer,
      wherein performing ultraviolet-ozone treatment on the electron transporting layer comprises performing ultraviolet-ozone treatment on the first surface of the electron transporting layer (i) before forming the photoactive layer on the electron transporting layer and (ii) such that a polymer-rich layer on the first surface of the electron transporting layer is substantially removed, thereby exposing at least a portion of the metal-oxide within the electron transporting layer at the first surface of the electron transporting layer.

2. The photovoltaic cell according to claim 1,
   wherein the photovoltaic cell has an inverted configuration, such that the first electrode is a cathode and the second electrode is an anode,
   wherein the method further comprises:
      forming the electron transporting layer on the first electrode;
      forming the hole transporting layer on the photoactive layer; and
      forming the second electrode on the hole transporting layer.

3. The photovoltaic cell according to claim 1,
wherein the electron transporting layer is formed of the metal-oxide-polymer composite, and
wherein the metal-oxide-polymer composite comprises metal oxide nanoparticles, such that the metal-oxide-polymer composite is a metal-oxide-polymer nanocomposite.

4. The photovoltaic cell according to claim 1,
wherein the electron transporting layer is a zinc oxide (ZnO)-polyvinylpyrollidone (PVP) nanocomposite film, and
wherein performing ultraviolet-ozone treatment on the electron transporting layer before forming the photoactive layer on the electron transporting layer comprises performing ultraviolet-ozone treatment on a first surface of the zinc oxide (ZnO)-polyvinylpyrollidone (PVP) nanocomposite film before forming the photoactive layer on the first surface of the zinc oxide (ZnO)-polyvinylpyrollidone (PVP) nanocomposite film, such that polyvinylpyrollidone (PVP) is removed from the first surface of the zinc oxide (ZnO)-polyvinylpyrollidone (PVP) nanocomposite film before forming the photoactive layer on the first surface of the zinc oxide (ZnO)-polyvinylpyrollidone (PVP) nanocomposite film.

5. The photovoltaic cell according to claim 1,
wherein the first electrode is a cathode and is formed of a transparent conductive oxide, and
wherein the second electrode is an anode and is formed of a metal.

6. The photovoltaic cell according to claim 1,
wherein the photoactive layer is formed of a polymer and a fullerene.

7. The photovoltaic cell according to claim 6,
wherein the fullerene is (6,6)-phenyl-C71-butyric acid methyl ester (PC71BM).

8. The photovoltaic cell according to claim 7,
wherein the polymer is poly(dithienogermole)-thienopyrrolodione (PDTG-TPD), poly(distannyl-dithienogermole)-thienopyrrolodione, or poly(dithienosilole)-thienopyrrolodione (PDTS-TPD).

9. The photovoltaic cell according to claim 1,
wherein the photoactive layer comprises copper indium gallium (di)selenide (CIGS).

10. The photovoltaic cell according to claim 1,
wherein the second electrode is transparent to at least a portion of visible light.

11. The photovoltaic cell according to claim 2,
wherein the electron transporting layer is a zinc oxide (ZnO)-polyvinylpyrrolidone (PVP) nanocomposite film,
wherein performing ultraviolet-ozone treatment on the electron transporting layer before forming the photoactive layer on the electron transporting layer comprises performing ultraviolet-ozone treatment on a first surface of the zinc oxide (ZnO)-polyvinylpyrollidone (PVP) nanocomposite film before forming the photoactive layer on the first surface of the zinc oxide (ZnO)-polyvinylpyrollidone (PVP) nanocomposite film, such that polyvinylpyrollidone (PVP) is removed from the first surface of the zinc oxide (ZnO)-polyvinylpyrollidone (PVP) nanocomposite film before forming the photoactive layer on the first surface of the zinc oxide (ZnO)-polyvinylpyrollidone (PVP) nanocomposite film,
wherein the first electrode comprises indium tin oxide (ITO),
wherein the second electrode comprises silver or aluminum,
wherein the photoactive layer comprises a polymer and a fullerene,
wherein the fullerene is (6,6)-phenyl-C71-butyric acid methyl ester (PC71BM),
wherein the polymer is poly(dithienogermole)-thienopyrrolodione (PDTG-TPD), poly(distannyl-dithienogermole)-thienopyrrolodione, or poly(dithienosilole)-thienopyrrolodione (PDTS-TPD), and
wherein the hole transporting layer comprises molybdenum oxide.

12. The photovoltaic cell according to claim 11,
wherein the first electrode is formed of indium tin oxide (ITO),
wherein the photoactive layer is formed of the polymer and the fullerene, and
wherein the hole transporting layer is formed of molybdenum oxide.

13. A photovoltaic cell, comprising:
a first electrode;
an electron transporting layer,
wherein the electron transporting layer is a zinc oxide (ZnO)-polyvinylpyrollidone (PVP) nanocomposite film,
a photoactive layer,
wherein the photoactive layer is on the electron transporting layer, such that a first surface of the photoactive layer is in contact with a first surface of the zinc oxide (ZnO)-polyvinylpyrollidone (PVP) nanocomposite film;
a hole transporting layer; and
a second electrode
wherein a PVP domain size of the first surface of the zinc oxide (ZnO)-polyvinylpyrollidone (PVP) nanocomposite film is in the range 50-100 nm and is smaller than a PVP domain size of a second surface of the zinc oxide (ZnO)-polyvinylpyrollidone (PVP) nanocomposite film, wherein the second surface is opposite to the first surface of the zinc oxide (ZnO)-polyvinylpyrollidone (PVP) nanocomposite film.

14. The photovoltaic cell according to claim 1,
wherein the electron transporting layer is a zinc oxide (ZnO)-polymer composite.

15. The photovoltaic cell according to claim 1,
wherein the electron transporting layer is a Titanium oxide (TiO$_2$)-polymer composite.

16. The photovoltaic cell according to claim 1,
wherein the electron transporting layer is a zinc oxide (ZnO)-polyvinylpyrollidone (PVP) composite film.

17. The photovoltaic cell according to claim 1,
wherein the electron transporting layer is:
(i) a Titanium oxide (TiO$_2$)-polyvinylpyrollidone (PVP) composite film; or
(ii) a Titanium oxide (TiO$_2$)-polyvinylpyrollidone (PVP) nanocomposite film.

18. The photovoltaic cell according to claim 4,
wherein the electron transporting layer is a Titanium oxide (TiO$_2$)-polyvinylpyrollidone (PVP) nanocomposite film, and
wherein the zinc oxide (ZnO)-polyvinylpyrollidone (PVP) nanocomposite film is:
(i) a ZnO colloidal nanoparticle (NP) film; or
(ii) a ZnO sol-gel processed film.

19. The photovoltaic cell according to claim 4,
wherein performing ultraviolet-ozone treatment on the first surface of the zinc oxide (ZnO)-polyvinylpyrollidone (PVP) nanocomposite film before forming the photoactive layer on the first surface of the zinc oxide (ZnO)-polyvinylpyrollidone (PVP) nanocomposite film comprises performing ultraviolet-ozone treatment on the first surface of the zinc oxide (ZnO)-polyvinylpyrrollidone (PVP) nanocomposite film before forming the photoactive layer on the first surface of the zinc oxide (ZnO)-polyvinylpyrrollidone (PVP) nanocomposite film for 5 to 30 minutes.

20. The photovoltaic cell according to claim 19,
wherein performing ultraviolet-ozone treatment on the first surface of the zinc oxide (ZnO)-polyvinylpyrrollidone (PVP) nanocomposite film before forming the photoactive layer on the first surface of the zinc oxide (ZnO)-polyvinylpyrrollidone (PVP) nanocomposite film for 5 to 30 minutes comprises performing ultraviolet-ozone treatment on the first surface of the zinc oxide (ZnO)-polyvinylpyrrollidone (PVP) nanocomposite film before forming the photoactive layer on the first surface of the zinc oxide (ZnO)-polyvinylpyrrollidone (PVP) nanocomposite film for 5 to 30 minutes via a UVO cleaner.

21. The photovoltaic cell according to claim 4,
wherein performing ultraviolet-ozone treatment on the first surface of the zinc oxide (ZnO)-polyvinylpyrrollidone (PVP) nanocomposite film before forming the photoactive layer on the first surface of the zinc oxide (ZnO)-polyvinylpyrrollidone (PVP) nanocomposite film comprises performing ultraviolet-ozone treatment on the first surface of the zinc oxide (ZnO)-polyvinylpyrrollidone (PVP) nanocomposite film before forming the photoactive layer on the first surface of the zinc oxide (ZnO)-polyvinylpyrrollidone (PVP) nanocomposite film:
increases a short circuit current (Jsc) of the photovoltaic cell;
increases a fill factor of the photovoltaic cell;
passivates the zinc oxide (ZnO)-polyvinylpyrrollidone (PVP) nanocomposite film;
exposes ZnO nanoclusters in the zinc oxide (ZnO)-polyvinylpyrrollidone (PVP) nanocomposite film to the first surface of the zinc oxide (ZnO)-polyvinylpyrrollidone (PVP) nanocomposite film;
improves charge collection by the zinc oxide (ZnO)-polyvinylpyrrollidone (PVP) nanocomposite film;
reduces a film thickness of the zinc oxide (ZnO)-polyvinylpyrrollidone (PVP) composite film;
removes PVP without significantly altering the size, shape, or spatial distribution of ZnO nanoclusters in the zinc oxide (ZnO)-polyvinylpyrrollidone (PVP) composite film;
increases charge collection of the photogenerated electrons of the photovoltaic cell;
increases average power conversion efficiency of the photovoltaic cell;
increases an external quantum efficiency (EQE) of the photovoltaic cell;
increases an r.m.s. roughness of the first surface of the zinc oxide (ZnO)-polyvinylpyrrollidone (PVP) composite film;
reduces a PVP domain size of the first surface of the zinc oxide (ZnO)-polyvinylpyrrollidone (PVP) composite film;
increases oxygen richness of chemical composition of ZnO nanoclusters on the first surface of the zinc oxide (ZnO)-polyvinylpyrrollidone (PVP) composite film;
decreases atomic concentration of carbon in the PVP in the zinc oxide (ZnO)-polyvinylpyrrollidone (PVP) composite film;
increases atomic concentration of oxygen in the PVP in the zinc oxide (ZnO)-polyvinylpyrrollidone (PVP) composite film;
increases atomic concentration of zinc in the PVP in the zinc oxide (ZnO)-polyvinylpyrrollidone (PVP) composite film; or
increases UV-visible-NIR transmission of the zinc oxide (ZnO)-polyvinylpyrrollidone (PVP) composite film.

22. The photovoltaic cell according to claim 4,
wherein performing ultraviolet-ozone treatment on the first surface of the zinc oxide (ZnO)-polyvinylpyrrollidone (PVP) nanocomposite film before forming the photoactive layer on the first surface of the zinc oxide (ZnO)-polyvinylpyrrollidone (PVP) nanocomposite film comprises performing ultraviolet-ozone treatment on the first surface of the zinc oxide (ZnO)-polyvinylpyrrollidone (PVP) nanocomposite film before forming the photoactive layer on the first surface of the zinc oxide (ZnO)-polyvinylpyrrollidone (PVP) nanocomposite film:
increases a short circuit current (Jsc) of the photovoltaic cell;
increases a fill factor of the photovoltaic cell;
passivates the zinc oxide (ZnO)-polyvinylpyrrollidone (PVP) nanocomposite film;
exposes ZnO nanoclusters in the zinc oxide (ZnO)-polyvinylpyrrollidone (PVP) nanocomposite film to the first surface of the zinc oxide (ZnO)-polyvinylpyrrollidone (PVP) nanocomposite film;
improves charge collection by the zinc oxide (ZnO)-polyvinylpyrrollidone (PVP)nanocomposite film;
reduces a film thickness of the zinc oxide (ZnO)-polyvinylpyrrollidone (PVP) composite film;
removes PVP without significantly altering the size, shape, or spatial distribution of ZnO nanoclusters in the zinc oxide (ZnO)-polyvinylpyrrollidone (PVP) composite film;
increases charge collection of the photogenerated electrons of the photovoltaic cell;
increases average power conversion efficiency of the photovoltaic cell;
increases an external quantum efficiency (EQE) of the photovoltaic cell;
increases an r.m.s. roughness of the first surface of the zinc oxide (ZnO)-polyvinylpyrrollidone (PVP) composite film;
reduces a PVP domain size of the first surface of the zinc oxide (ZnO)-polyvinylpyrrollidone (PVP) composite film;
increases oxygen richness of chemical composition of ZnO nanoclusters on the first surface of the zinc oxide (ZnO)-polyvinylpyrrollidone (PVP) composite film;
decreases atomic concentration of carbon in the PVP in the zinc oxide (ZnO)-polyvinylpyrrollidone (PVP) composite film;
increases atomic concentration of oxygen in the PVP in the zinc oxide (ZnO)-polyvinylpyrrollidone (PVP) composite film;
increases atomic concentration of zinc in the PVP in the zinc oxide (ZnO)-polyvinylpyrrollidone (PVP) composite film; and
increases UV-visible-NIR transmission of the zinc oxide (ZnO)-polyvinylpyrrollidone (PVP) composite film.

* * * * *